US010734403B2

(12) United States Patent
Eom et al.

(10) Patent No.: US 10,734,403 B2
(45) Date of Patent: Aug. 4, 2020

(54) NONVOLATILE MEMORY DEVICES COMPRISING A CONDUCTIVE LINE COMPRISING PORTIONS HAVING DIFFERENT PROFILES AND METHODS OF FABRICATING THE SAME

(71) Applicants: Taeyong Eom, Anyang-si (KR); Jiwoon Im, Hwaseong-si (KR); Byungsun Park, Suwon-si (KR); Hyunseok Lim, Suwon-si (KR); Yu Seon Kang, Hwaseong-si (KR); Hyukho Kwon, Hwaseong-si (KR); Sungjin Park, Seongnam-si (KR); Jiyoun Seo, Seoul (KR); Dong Hyeop Ha, Daegu (KR)

(72) Inventors: Taeyong Eom, Anyang-si (KR); Jiwoon Im, Hwaseong-si (KR); Byungsun Park, Suwon-si (KR); Hyunseok Lim, Suwon-si (KR); Yu Seon Kang, Hwaseong-si (KR); Hyukho Kwon, Hwaseong-si (KR); Sungjin Park, Seongnam-si (KR); Jiyoun Seo, Seoul (KR); Dong Hyeop Ha, Daegu (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 12 days.

(21) Appl. No.: 15/991,309

(22) Filed: May 29, 2018

(65) Prior Publication Data
US 2019/0081067 A1 Mar. 14, 2019
US 2020/0194449 A9 Jun. 18, 2020

(30) Foreign Application Priority Data

Sep. 8, 2017 (KR) ........................ 10-2017-0115384

(51) Int. Cl.
H01L 27/11582 (2017.01)
G11C 16/02 (2006.01)
(Continued)

(52) U.S. Cl.
CPC ........ *H01L 27/11582* (2013.01); *G11C 16/02* (2013.01); *H01L 27/1157* (2013.01); *H01L 27/11543* (2013.01)

(58) Field of Classification Search
CPC ......... H01L 27/11582; H01L 27/11543; H01L 27/1157; G11C 16/02
See application file for complete search history.

(56) References Cited

U.S. PATENT DOCUMENTS 8,557,695 B2 10/2013 Mizukami et al.
8,748,249 B2 6/2014 Yang et al.
(Continued)

*Primary Examiner* — David Lam
(74) *Attorney, Agent, or Firm* — Myers Bigel, P.A.

(57) ABSTRACT

Nonvolatile memory devices and methods of fabricating the nonvolatile memory devices are provided. The nonvolatile memory devices may include a stacked structure including a plurality of conductive films and a plurality of interlayer insulating films stacked in an alternate sequence on a substrate and a vertical channel structure extending through the stacked structure. The plurality of conductive films may include a selection line that is closest to the substrate among the plurality of conductive films. The selection line may include a lower portion and an upper portion sequentially stacked on the substrate, and a side of the upper portion of the selection line and a side of the lower portion of the selection line may have different profiles.

20 Claims, 25 Drawing Sheets

(51) Int. Cl.
*H01L 27/11543* (2017.01)
*H01L 27/1157* (2017.01)

(56) References Cited

U.S. PATENT DOCUMENTS

| | | | |
|---|---|---|---|
| 9,099,527 B2* | 8/2015 | Yoo | H01L 29/7926 |
| 9,240,419 B2 | 1/2016 | Chang et al. | |
| 9,275,909 B2 | 3/2016 | Jayanti et al. | |
| 9,276,011 B2 | 3/2016 | Simsek-Ege et al. | |
| 9,431,410 B2 | 8/2016 | Sun et al. | |
| 9,437,604 B2 | 9/2016 | Lu et al. | |
| 9,559,109 B2 | 1/2017 | Simsek-Ege et al. | |
| 2015/0380549 A1* | 12/2015 | Yun | H01L 23/528 |
| | | | 257/329 |
| 2017/0025438 A1* | 1/2017 | Lee | H01L 27/11582 |
| 2017/0062468 A1 | 3/2017 | Son et al. | |
| 2017/0133400 A1 | 5/2017 | Yoo et al. | |
| 2017/0148809 A1 | 5/2017 | Nishikawa et al. | |

* cited by examiner

NONVOLATILE MEMORY DEVICES COMPRISING A CONDUCTIVE LINE COMPRISING PORTIONS HAVING DIFFERENT PROFILES AND METHODS OF FABRICATING THE SAME

CROSS-REFERENCE TO RELATED APPLICATION

This application claims priority under 35 U.S.C. § 119 to Korean Patent Application No. 10-2017-0115384 filed on Sep. 8, 2017 in the Korean Intellectual Property Office, the disclosure of which is hereby incorporated by reference in its entirety.

BACKGROUND

The present disclosure generally relates to the field of electronics and, more particularly, a nonvolatile memory device and a method of fabricating the same.

Memory devices may be classified into volatile memory devices and nonvolatile memory devices. Volatile memory devices may not retain data when a power is not provided, and nonvolatile memory devices may retain data even when the power is not provided.

In order to increase the degree of integration of nonvolatile memory devices, in particular, flash memory devices, three dimensional memory elements have been proposed. The three dimensional semiconductor memory elements may include vertically stacked memory cells and vertical channels.

SUMMARY

According to some embodiments of the present inventive concept, nonvolatile memory devices may include a stacked structure including a plurality of conductive films and a plurality of interlayer insulating films stacked in an alternate sequence on a substrate and a vertical channel structure extending through the stacked structure. The plurality of conductive films may include a selection line that is closest to the substrate among the plurality of conductive films. The selection line may include a lower portion and an upper portion sequentially stacked on the substrate, and a side of the upper portion of the selection line and a side of the lower portion of the selection line may have different profiles.

According to some embodiments of the present inventive concept, methods of fabricating a nonvolatile memory device may include sequentially forming a lower insulating film and an etching stop film on a substrate and forming a mold structure on the etching stop film. The mold structure may include a plurality of sacrificial films and a plurality of interlayer insulating films stacked in an alternate sequence. The methods may also include forming a trench extending through the mold structure to expose the etching stop film, sequentially etching the etching stop film and the lower insulating film to form a channel hole, forming a channel structure in the channel hole, simultaneously removing the plurality of sacrificial films and the etching stop film to form a plurality of openings, and forming a plurality of conductive films in the plurality of openings, respectively. The channel hole may expose an upper surface of the substrate.

According to some embodiments of the present inventive concept, nonvolatile memory devices may include a stacked structure including a plurality of conductive films and a plurality of interlayer insulating films stacked in an alternate sequence on a substrate and a vertical channel structure extending through the stacked structure. The plurality of conductive films may include a first conductive film that is closest to the substrate among the plurality of conductive films. The first conductive film may include a lower portion and an upper portion sequentially stacked on the substrate, and a side of the upper portion of the first conductive film may have a profile different from a profile of a side of the lower portion of the first conductive film.

According to some embodiments of the present inventive concept, methods of fabricating a nonvolatile memory device may include sequentially forming a lower insulating film and an etching stop film on a substrate, and forming a mold structure on the etching stop film. The mold structure may include a plurality of sacrificial films and a plurality of interlayer insulating films stacked in an alternate sequence. The methods may also include forming a trench extending through the mold structure to expose the etching stop film, forming a dielectric film extending on an inner sidewall of the trench and on the etching stop film, sequentially etching a portion of the dielectric film on the etching stop film, the etching stop film, and the lower insulating film to form a channel hole, forming a dielectric material in the channel hole, simultaneously removing the plurality of sacrificial films and the etching stop film to form a plurality of openings, and forming a plurality of conductive films in the plurality of openings, respectively. The channel hole may expose an upper surface of the substrate.

According to some embodiments of the present inventive concept, methods of fabricating a nonvolatile memory device may include forming a stack including a plurality of gate lines and a plurality of insulating layers stacked in an alternate sequence on a substrate. The plurality of gate lines may include a lowermost gate line that is closest to the substrate among the plurality of gate lines. The lowermost gate line may include a lower portion and an upper portion sequentially stacked on the substrate, a side of the lower portion of the lowermost gate line has a first angle with respect to an upper surface of the substrate, and a side of the upper portion of the lowermost gate line has a second angle with respect to the upper surface of the substrate, and the first angle is greater than the second angle.

DETAILED DESCRIPTION

Figure 1:
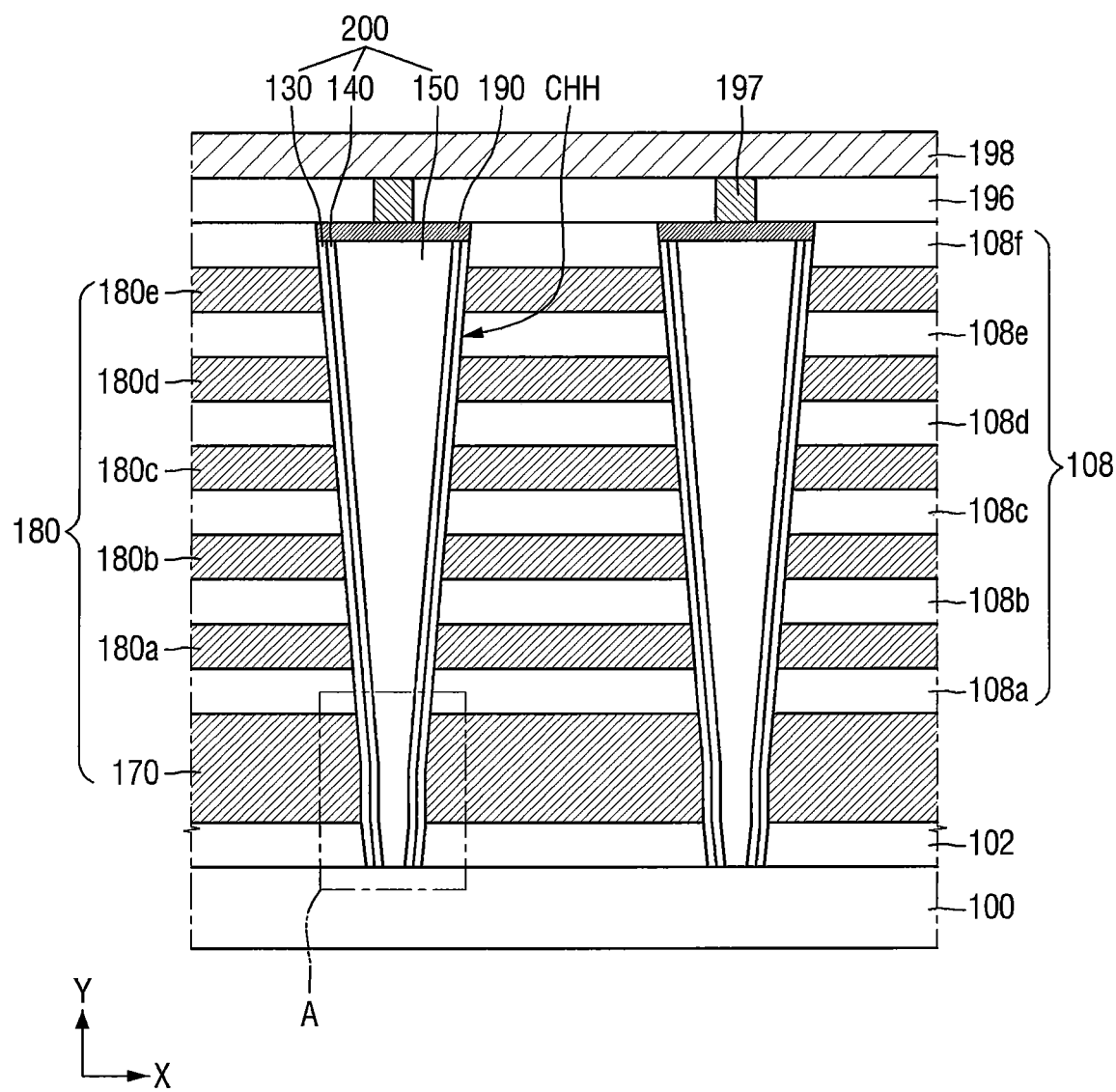
FIG. 1 is a cross-sectional view of a nonvolatile memory device according to some embodiments of the present inventive concept.

Advantages and features of the present inventive concept and methods of accomplishing the same may be understood more readily by reference to the following detailed description and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. In the drawings, the thickness of layers and regions are exaggerated for clarity. Like reference numbers refer to like elements throughout.

As used herein the term "and/or" includes any and all combinations of one or more of the associated listed items. It will be understood that "simultaneously removing" refers to removing in a same fabrication step, at approximately (but not necessarily exactly) the same time.

FIG. 1 is a cross-sectional view of a nonvolatile memory device according to some embodiments of the present inventive concept.

Figure 2:
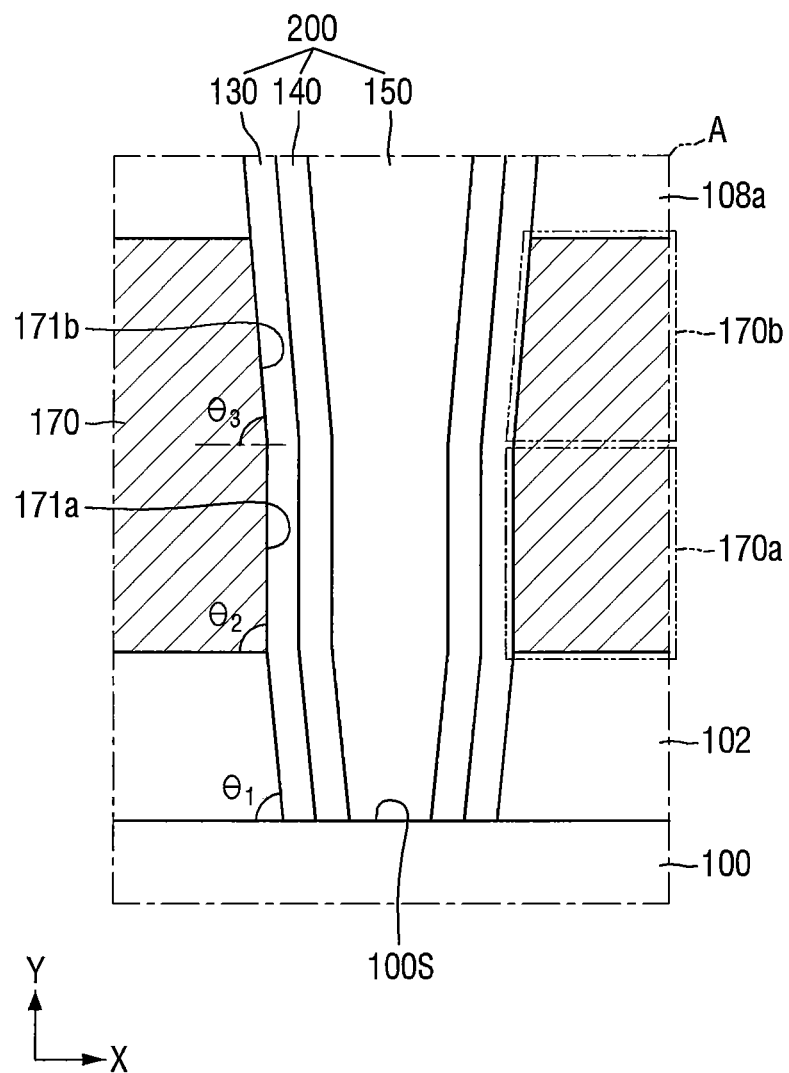
FIG. 2 is an enlarged view of the portion A of FIG. 1 according to some embodiments of the present inventive concept.

FIG. 2 is an enlarged view of the portion A of FIG. 1.

Referring to FIGS. 1 and 2, a nonvolatile memory device according to some embodiments of the present inventive concept includes a substrate 100, a lower insulating film 102, interlayer insulating films 108 (e.g., 108a, 108b, 108c, 108d, 108e, and 108f), conductive films 180 (e.g., 170, 180a, 180b, 180c, 180d, 180e, and 180f), a pad 190, an upper insulating film 196, a channel structure 200, a conductive contact 197, and a bit line 198. The conductive films 180 are spaced apart from each other in a vertical direction (e.g., Y direction).

The substrate 100 may be, for example, bulk silicon or silicon-on-insulator (SOI). In some embodiments, the substrate 100 may be a silicon substrate or may include other materials, for example, silicon germanium, indium antimonide, lead tellurium compounds, indium arsenide, indium phosphide, gallium arsenide and/or gallium antimonide. In some embodiments, the substrate 100 may include an epitaxial layer formed on a base substrate.

The lower insulating film 102 may be formed on the substrate 100. The lower insulating film 102 may include, for example, but is not limited to, a silicon oxide film, a silicon nitride film, or a silicon oxynitride film. The lower insulating film 102 may be directly adjacent to the substrate 100. That is, no other component may be interposed between the lower insulating film 102 and the substrate 100. In some embodiments, the lower insulating film 102 may directly contact the substrate 100.

The conductive films 180 and the interlayer insulating films 108 may be alternately laminated on the lower insulating film 102. In some embodiments, the conductive films 180 and the interlayer insulating films 108 may stacked on the lower insulating film 102 in an alternating sequence as illustrated in FIG. 1. The conductive films 180 may include a plurality of gate electrodes. In some embodiments, the conductive film 180 may include a selection line 170 (e.g., a gate selection line and a string selection line) and a plurality of gate lines 180a to 180e on the selection line 170. In some embodiments, the selection line 170 is a gate selection line, and the selection line 170 will be referred to as a gate selection line. It, however, will be understood that the selection line 170 can be a string selection line.

The gate selection line 170 may be formed on the lower insulation film 102. A gate selection signal for selecting a cell string included in the nonvolatile memory device of the present inventive concept may be applied to the gate selection line 170.

The gate selection line 170 may include a conductive material and may include, for example, but is not limited to, at least one of tungsten, copper, metal silicide, doped silicon, or a conductive metal nitride film.

The gate selection line 170 may be directly adjacent to the lower insulating film 102. In some embodiments, the gate selection line 170 may directly contact the lower insulating film 102, as illustrated in FIG. 1. The gate selection line 170 of the conductive films 180 may be closest to the substrate 100, and thus any one of the conductive films 180 may not be interposed between the gate selection line 170 and the substrate 100 or between the gate selection line 170 and the lower insulating film 180. Therefore, the gate selection line 170 may be a gate electrode located at the lowermost level among the conductive films 180.

Further, any one of the interlayer insulating films 108 may not be interposed between the gate selection line 170 and the lower insulating film 102.

Referring to FIG. 2, the gate selection line 170 may include a lower part 170a and an upper part 170b. The lower part 170a of the gate selection line 170 may directly abut on the lower insulating film 102. The upper part 170b of the gate selection line 170 may be on the upper part 170a and may directly abut on the interlayer insulating film 108a. In some embodiments, the lower part 170a of the gate selection line 170 may directly contact an upper surface of the lower insulating film 102, and the upper part 170b of the gate selection line 170 may directly contact a lower surface of the lowermost interlayer insulating film 108a, as illustrated in FIG. 2.

A lower sidewall 171a of the gate selection line 170 may directly abut on the channel structure 200 and may directly abut on a dielectric film 130 as illustrated in FIG. 2. The lower sidewall 171a of the gate selection line 170 may directly contact the channel structure 200, specifically, a dielectric film 130 of the channel structure 200, as illustrated in FIG. 2.

An upper sidewall 171b of the gate selection line 170 may directly abut on the channel structure 200 and may directly abut on the dielectric film 130 as illustrated in FIG. 2. The upper sidewall 171b of the gate selection line 170 may directly contact the channel structure 200, specifically, the dielectric film 130 of the channel structure 200, as illustrated in FIG. 2. In some embodiments, an upper portion of the channel structure 200 that contact the upper sidewall 171b of the gate selection line 170 has a width in a horizontal direction (e.g., X direction) tapering toward the substrate 100.

In some embodiments of the present inventive concept, the lower part 170a and upper part 170b of the gate selection line 170 may have different sidewall profiles.

In some embodiments, the lower sidewall 171a of the gate selection line 170 may have a second angle $\theta 2$ with respect to an upper surface 100S of the substrate 100, the upper sidewall 171b of the gate selection line 170 may have a third angle $\theta 3$ with respect to the upper surface 100S of the substrate 100, and the second angle $\theta 2$ may be different from the third angle $\theta 3$, as illustrated in FIG. 2. In some embodiments, the second angle $\theta 2$ may be greater than the third angle $\theta 3$. In some embodiments, the upper sidewall 171b of the gate selection line 170 may have a negative slope, as illustrated in FIG. 2.

In some embodiments, the slope of the lower sidewall 171a of the gate selection line 170 may be greater than the slope of the upper sidewall 171b of the gate selection line 170 with respect to the upper surface 100S of the substrate 100.

In some embodiments, the second angle θ2 is formed to be different from (e.g., greater than) the third angle θ3 by processes of forming a channel hole CHH extending through the conductive films 180 and the interlayer insulating films 108. Detailed description thereof will be provided later.

Although FIGS. 1 and 2 illustrate that the thickness of the gate selection line 170 is thicker than the thicknesses of the other gate lines 180a to 180e, the present inventive concept is not limited thereto. In some embodiments, the thickness of the gate selection line 170 may be the same as the thicknesses of other gate lines 180a to 180e.

In some embodiments, the sidewall of the lower insulating film 102 may have a first angle θ1 with respect to the upper surface 100S of the substrate 100, and the first angle θ1 may be the same as the third angle θ3.

The plurality of gate lines 180a to 180e may be laminated alternately with the plurality of interlayer insulating films 108a on the gate selection line 170. FIG. 1 illustrates an example in which a total of six conductive films 180 including the gate selection line 170 and the gate lines 180a to 180e are formed, but this is merely an example, and thus the present inventive concept is not limited thereto. It will be understood that the number of laminated conductive films 180 may vary depending on the design of the nonvolatile memory device according to some embodiments of the present inventive concept.

The gate lines 180a to 180e may be the gate electrodes of the memory cell transistors included in the nonvolatile memory device according to some embodiments of the present inventive concept. In some embodiments, the uppermost gate line 180e among the laminated plurality of conductive films 180 may be a gate electrode of a string selection transistor, to which a string selection signal is provided.

The plurality of gate lines 180a through 180e may include a conductive material and may include, for example, but is not limited to, at least one of tungsten, copper, metal silicide, doped silicon, or a conductive metal nitride film.

The interlayer insulating films 108 may be formed between the plurality of conductive films 180 to provide insulation between the plurality of conductive films 180. The interlayer insulating film 108 may include, for example, but is not limited to, a silicon oxide film, a silicon nitride film, and/or a silicon oxynitride film.

In FIG. 1, the six interlayer insulating films 108a to 108f are illustrated to be laminated on the gate selection line 170, but this is an example, and it will be understood that the number of laminated interlayer insulating films 108a to 108f may vary depending on the design of the nonvolatile memory device according to some embodiments of the present inventive concept.

The channel hole CHH may be formed to extend through the interlayer insulating films 108 and the conductive films 180 that are alternately laminated (e.g., stacked). The channel hole CHH may expose the upper surface 100S of the substrate 100. As illustrated in FIG. 1, the channel hole CHH may have a shape in which the width decreases as it approaches the upper surface 100S of the substrate. Therefore, a cross-section of the channel hole CHH may have an inverted trapezoidal shape.

The channel structure 200 may be in the channel hole CHH. In some embodiments, the channel structure 200 may fill the channel hole CHH. The channel structure 200 may include a dielectric film 130, a channel film 140, and a filling film 150.

Figure 10:
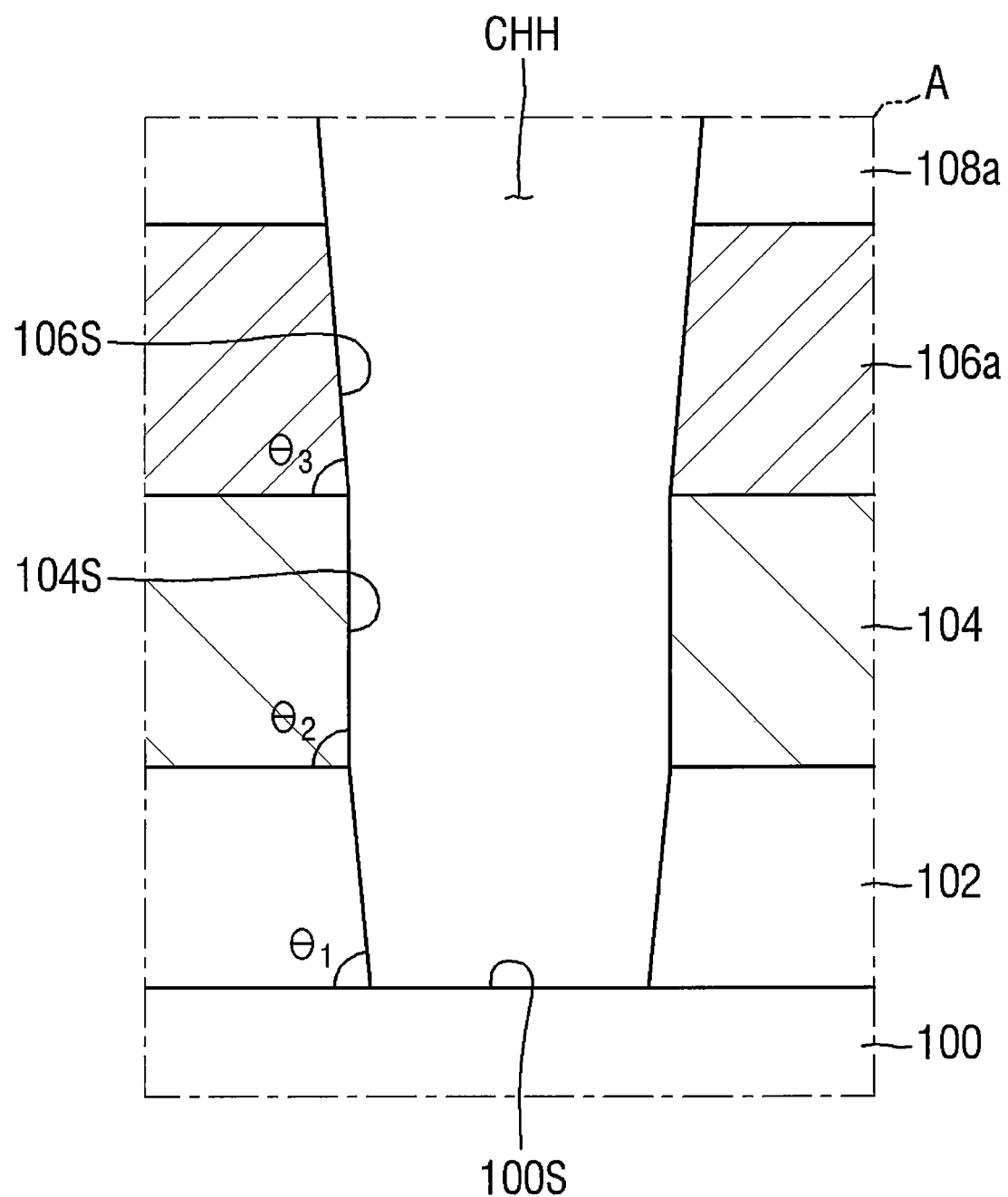

The dielectric film 130 may be formed along the inner sidewall of the channel hole CHH. The dielectric film 130 may extend along the inner sidewall of the channel hole CHH as illustrated in FIG. 10. The internal space of the channel hole CHH may be defined by the dielectric film 130 formed on the sidewalls of the channel hole CHH.

The dielectric film 130 may be formed along the profiles of the sidewalls of the conductive films 180 and the interlayer insulating film 108 that are alternately laminated. As described above, the profiles of the upper sidewall 171b and the lower sidewall 171a of the gate selection line 170 may be different from each other. Therefore, the sidewall profiles of the dielectric film 130 formed on the upper sidewall 171b of the gate selection line 170 and the dielectric film 130 formed on the lower sidewall 171a of the gate selection line 170 may be different from each other.

The dielectric film 130 may include, for example, a tunnel film and/or a trap film. The tunnel film may be a portion through which charges pass and may be formed of, for example, a silicon oxide film or multiple layers (e.g., two layers) including a silicon oxide film and a silicon nitride film.

The trap film may be a portion in which charges that have passed through the tunnel film are stored and may include, for example, a nitride film and/or a high dielectric constant (high-k) film. The nitride film may include, for example, one or more of silicon nitride, silicon oxynitride, and/or hafnium oxynitride.

The channel film 140 may be formed on the dielectric film 130. The channel film 140 may not completely fill the channel hole CHH and may expose the upper surface 100S of the substrate. However, the present inventive concept is not limited thereto, and, in some embodiments, the channel film 140 may cover the upper surface 100S of the substrate.

In some embodiments, the channel film 140 may include, for example, but is not limited to, polysilicon and/or amorphous silicon doped with impurities.

The filling film 150 may be on the channel film 140. In some embodiments, the filling film 150 may completely fill the space defined by the upper surface 100S of the substrate and the channel film 140. The outer surface of the filling film 150 may be surrounded by the channel film 140 and the dielectric film 130.

The filling film 150 may include an insulating material and may include, for example, silicon oxide.

The pad 190 may be formed in the channel hole CHH. The pad 190 may be formed on the dielectric film 130, the channel film 140, and the filling film 150. The pad 190 may function as a drain node. The pad 190 may include, but is not limited to, at least one of, for example, doped semiconductors, metals, metal silicide, and metal nitrides.

The upper insulating film 196 may be formed on a laminated structure in which the interlayer insulating films 108 and the conductive films 180 are alternately laminated. The upper insulating film 196 may cover the upper surfaces of the uppermost interlayer insulating film 108f and the pad 190. The upper insulating film 196 may provide electrical insulation between the bit line 198 and the pad 190.

The upper insulating film 196 may include, but is not limited to, an insulating material such as silicon oxide.

The conductive contact 197 may be formed in the upper insulating film 196. The conductive contact 197 may penetrate through the upper insulating film 196 to electrically connect the pad 190 and the bit line 198.

The conductive contact 197 may include a conductive material. The conductive contact 197 may include, but is not limited to, at least one of tungsten, copper, metal silicide, doped silicon, or a conductive metal nitride film.

Figure 3:
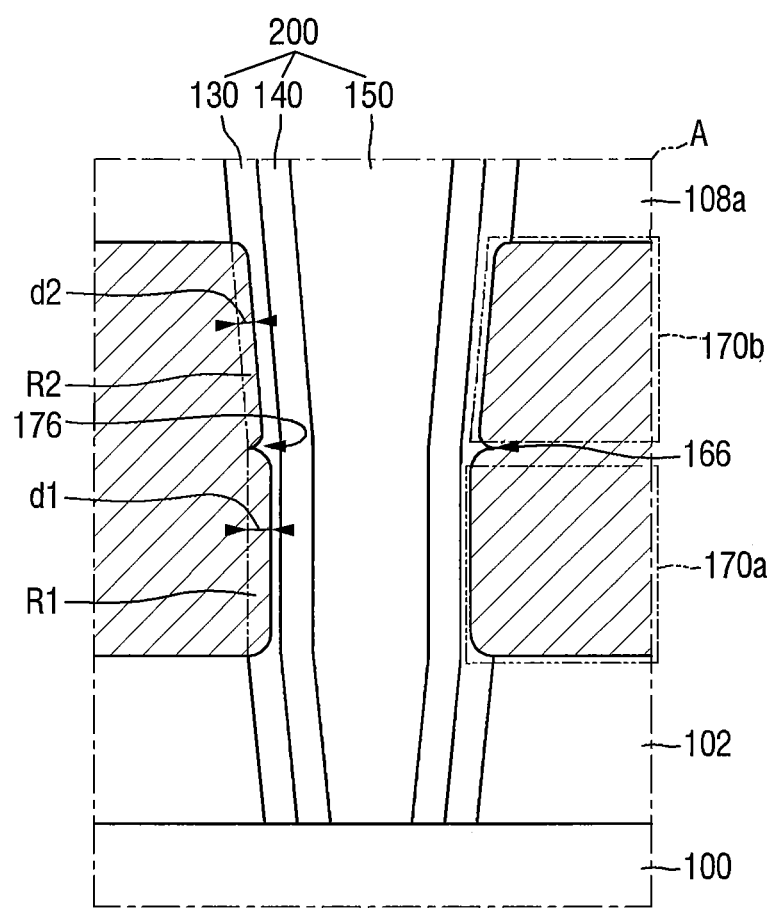
FIG. 3 is an enlarged view of the portion A of FIG. 1 according to some embodiments of the present inventive concept.

FIG. 3 is an enlarged view of the portion A of FIG. 1 according to some embodiments of the present inventive concept.

Referring to FIG. 3, the nonvolatile memory according to some embodiments of the present inventive concept may include a first recess R1 and a second recess R2 formed in the dielectric film 130.

The first recess R1 may be filled with the lower part 170a of the gate selection line 170, and the second recess R2 may be filled with the upper part 170b of the gate selection line 170. Therefore, the side surface profiles of the lower part 170a and the upper part 170b of the gate selection line 170 may be formed along the inner wall profiles of the first recess R1 and the second recess R2. Therefore, the side surface profile of the lower part 170a of the gate selection line 170 may be different from the side surface profile of the upper part 170b of the gate selection line 170.

A first depth d1 of the first recess R1 and a second depth d2 of the second recess R2 may be different from each other, as illustrated in FIG. 3. In some embodiments, the first depth d1 of the first recess R1 may be larger (e.g., deeper) than the second depth d2 of the second recess R2. It will be understood that the first depth d1 and the second depth d2 are depths in a horizontal direction that is parallel to the upper surface 100S of the substrate 100.

Since the first depth d1 and the second depth d2 of the first recess R1 and the second recess R2 are different from each other, the dielectric film 130 may include a protrusion 176. The protrusion 176 may be a portion protruding to the outside of the dielectric film 130 from the first recess R1 or the second recess R2. In some embodiments, the protrusion 176 may protrude into the gate selection line 170 as illustrated in FIG. 3.

The gate selection line 170 may include a concave portion 166 recessed toward the gate selection line 170. The concave portion 166 may be located between the lower part 170a and the upper part 170b of the gate selection line 170. The concave portion 166 may be a portion recessed toward the inside of the gate selection line 170 from the lower part 170a or the upper part 170b of the gate selection line 170.

Figure 4:
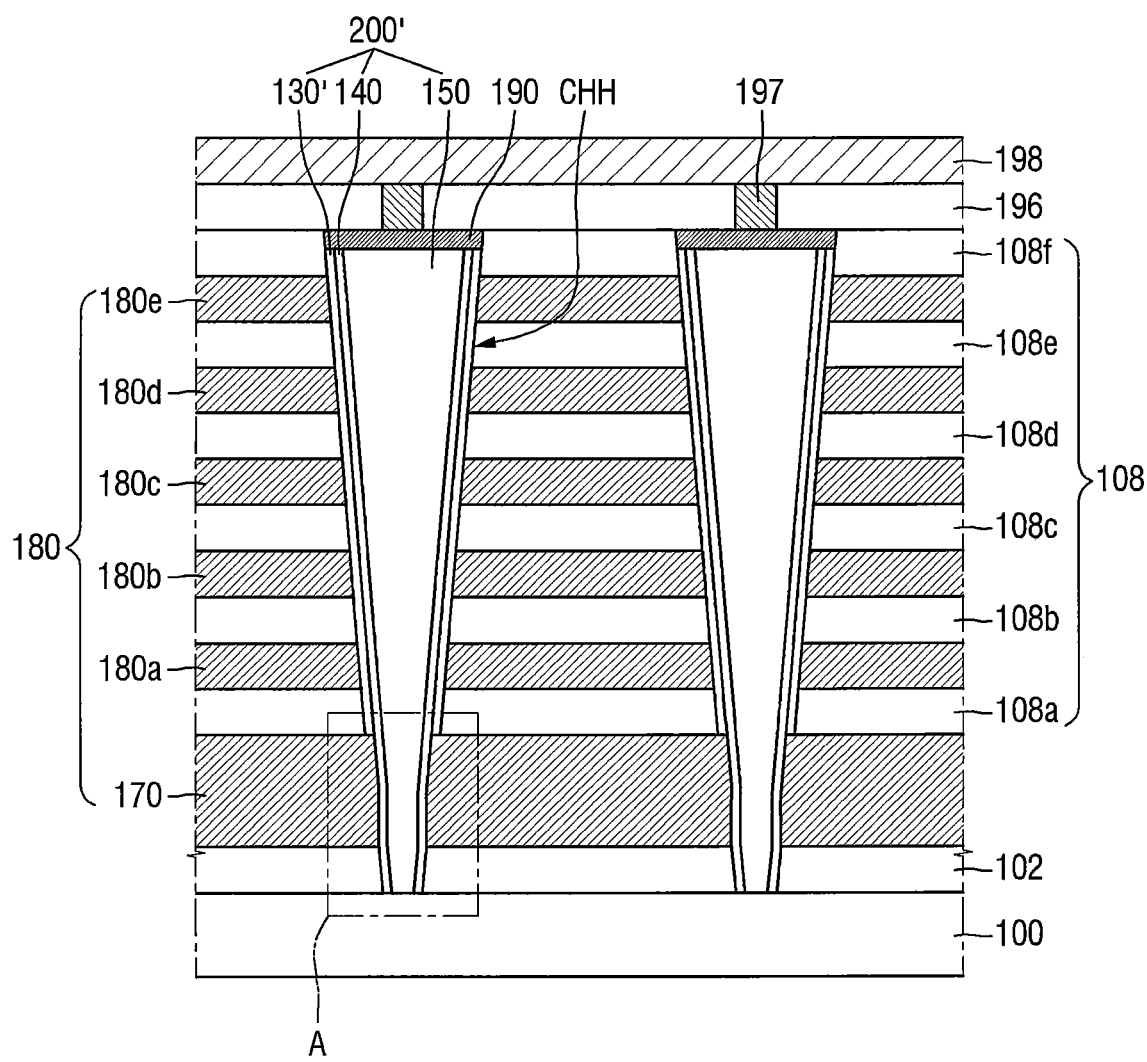
FIG. 4 is a cross-sectional view of a nonvolatile memory device according to some embodiments of the present inventive concept.
Figure 5:
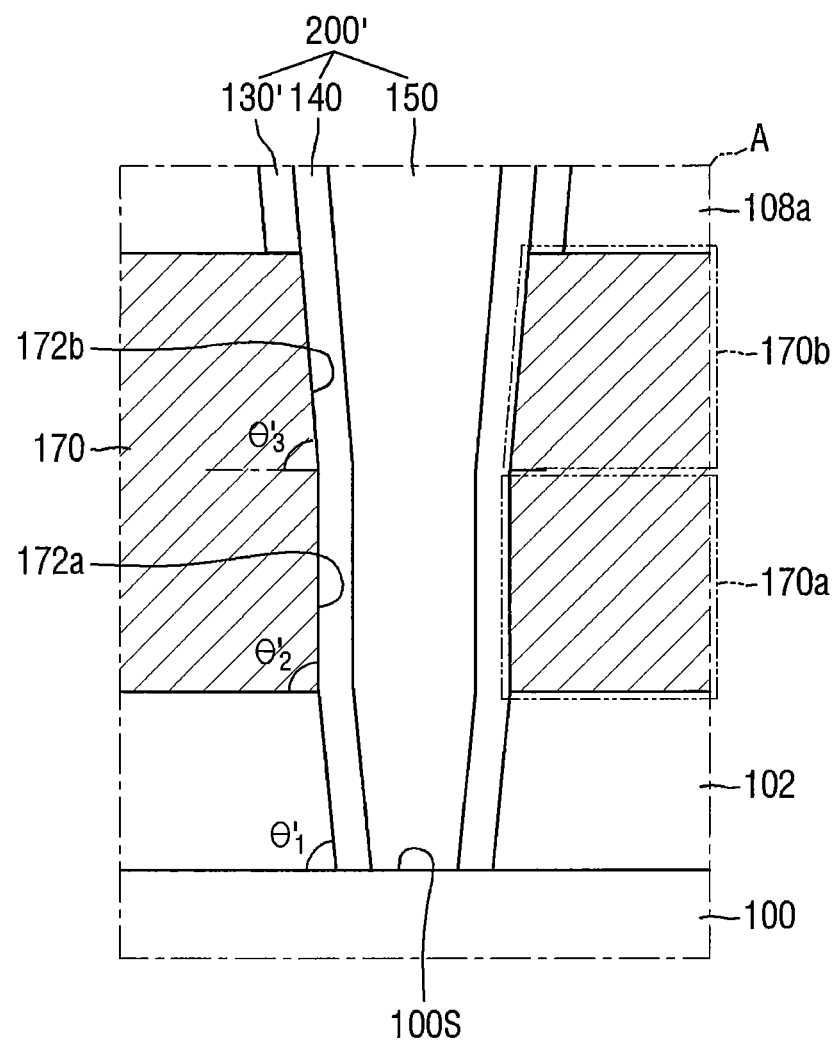
FIG. 5 is an enlarged view of the portion A of FIG. 4.

FIG. 4 is a cross-sectional view of a nonvolatile memory device according to some embodiments of the present inventive concept, and FIG. 5 is an enlarged view of the portion B of FIG. 4.

Referring to FIGS. 4 and 5, the nonvolatile memory device according to some embodiments of the present inventive concept may include a channel structure 200' different from illustrated in FIGS. 1, 2 and 3. The description of the repeated parts will not be provided below, and differences will be mainly described.

A dielectric film 130' may not extend to the upper and lower sidewalls 172b and 172a of the gate selection line 170. Therefore, the sidewalls 172a and 172b of the gate selection line 170 may not be covered with the dielectric film 130'. The sidewalls 172a and 172b of the gate selection line 170 may be covered with the channel film 140. The sidewalls 172a and 172b of the gate selection line 170 may directly abut on the channel film 140. The sidewalls 172a and 172b of the gate selection line 170 may directly contact the channel film 140 as illustrated in FIG. 4. Since the dielectric film 130' does not extend on the lower sidewall 172a of the gate selection line 170, the sidewalls of the lower insulating film 102 may also not be covered with the dielectric film 130'. The sidewalls of the lower insulating film 102 may be covered with the channel film 140. The sidewall of the lower insulating film 102 may directly abut on the channel film 140. The sidewall of the lower insulating film 102 may directly contact the channel film 140

In some embodiments, as illustrated in FIGS. 4 and 5, a second angle $\theta2'$ of the lower sidewall 172a of the gate selection line 170 with respect to the upper surface 100S of the substrate 100 may be different from a third angle $\theta3'$ of the upper sidewall 172b of the gate selection line 170 with respect to the upper surface 100S of the substrate 100. In some embodiments, the second angle $\theta2'$ may be greater than the third angle $\theta3'$. In some embodiments, the sidewall of the lower insulating film 102 may have a first angle $\theta1'$ with respect to the upper surface 100S of the substrate 100. In some embodiments, the second angle $\theta2$ may be greater than the third angle $\theta3$. In some embodiments, the upper sidewall 172b of the gate selection line 170 may have a negative slope, as illustrated in FIG. 5.

FIGS. 6 to 16 are views illustrating a method of fabricating a nonvolatile memory device according to some embodiments of the present inventive concept.

Figure 6:
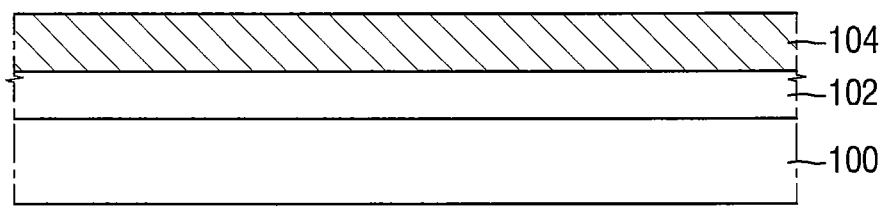
FIGS. 6 to 16 are views illustrating a method of fabricating a nonvolatile memory device according to some embodiments of the present inventive concept.

Referring to FIG. 6, the lower insulating film 102 and an etching stop film 104 are formed on the substrate 100.

The lower insulating film 102 may be provided by forming a material such as a silicon oxide film through processes, for example, a chemical vapor deposition (CVD), a plasma enhanced CVD (PECVD), and/or an atomic layer deposition (ALD).

The etching stop film 104 may include a material different from the lower insulating film 102. The etching stop film 104 may include a material having an etching selectivity with respect to the lower insulating film 102 when a specific etching solution or a specific etching gas are used.

The etching stop film 104 may include an oxide film such as TiO, ZrO, AlO, WO, BeO, BO, MgO, HfO, YbO, CaO, PbO, SrO, BaO, and SnO, a carbide film such as C, SiC, and WC, and/or a nitride film such as TaN, AlN, and WN. In some embodiments, the etching stop film 104 may also include a mixture of one of the oxide film, the carbide film, and the nitride film, with silicon oxide and/or silicon nitride.

The etching stop film 104 may be formed on the lower insulating film 102 using a method such as CVD and ALD, but the present inventive concept is not limited thereto.

Figure 7:
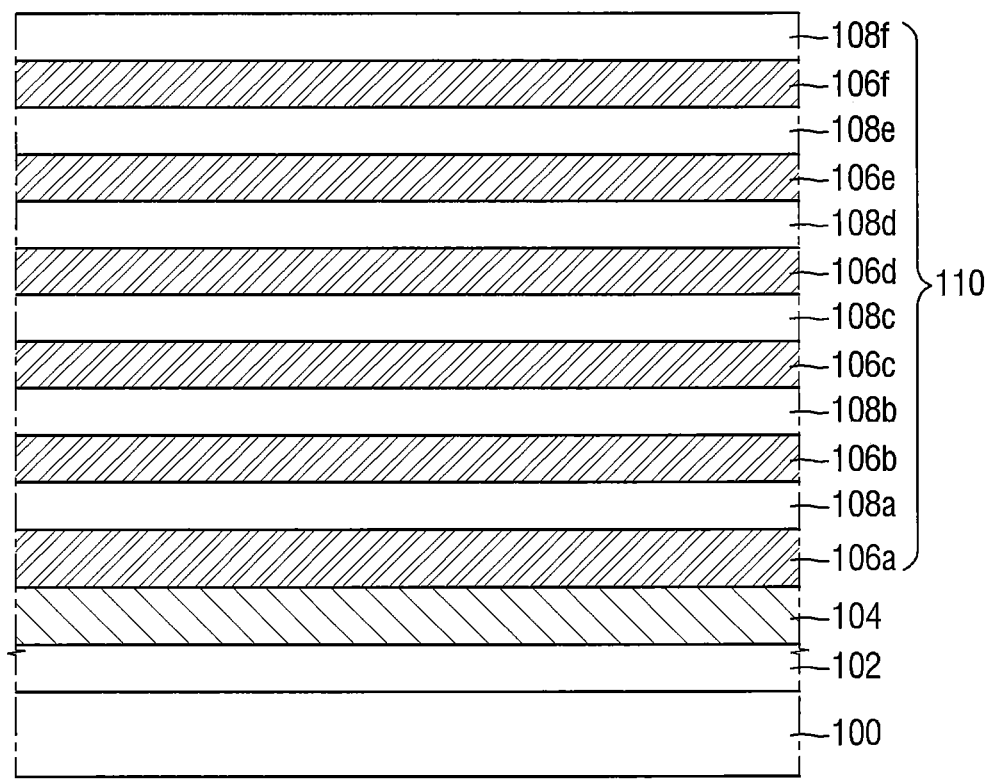

Referring to FIG. 7, a mold structure 110 in which sacrificial films 106a, 106b, 106c, 106d, 106d, 106f, and 106f and interlayer insulating films 108a to 108f (collectively 108) are alternately laminated (e.g., stacked) is formed on the etching stop film 104. In some embodiments, the lowermost sacrificial film 106a may be formed directly on the etching stop film 104 and thus may directly contact the etching stop film 104 as illustrated in FIG. 7.

The sacrificial films 106a to 106f may include materials different from that of the etching stop film 104. Specifically, the sacrificial films 106a to 106f may include materials having an etching selectivity with respect to the etching stop film 104 when a specific etching solution or a specific etching gas are used. For example, the sacrificial films 106a to 106f may include a silicon nitride film.

In some embodiments, interlayer insulating films 108a to 108f may include the same material as the lower insulating film 102. This is to leave only the lower insulating film 102 and the interlayer insulating films 108 by simultaneously removing the sacrificial films 106a to 106f and the etching stop film 104 later. However, the present inventive concept is not limited thereto, and the interlayer insulating films 108 may include a material which can have an etch selectivity with respect to the sacrificial films 106a to 106f and the etching stop film 104. The interlayer insulating films 108 may include, for example, but is not limited to, a material such as a silicon oxide film.

The interlayer insulating films 108 and the etching stop film 104 may include different materials from each other. Specifically, the etching stop film 104 may include a material having an etching selectivity with respect to the lower insulating film 102 when a specific etching solution or a specific etching gas are used.

Figure 8:
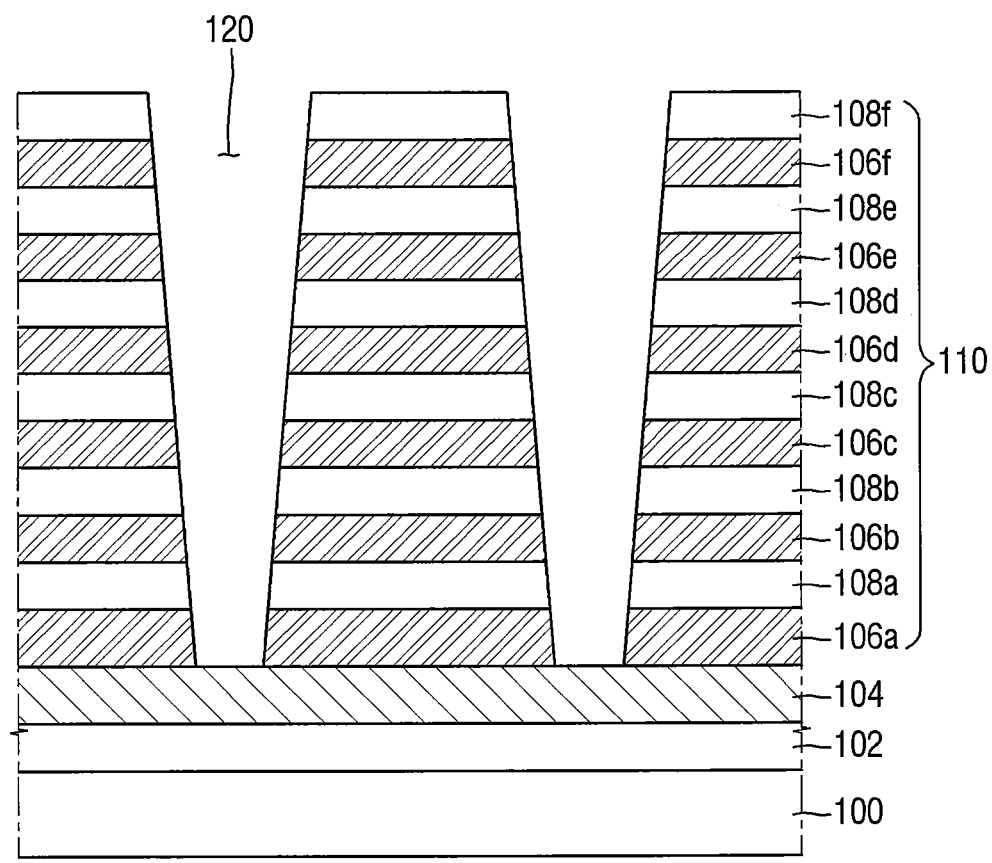

Referring to FIG. 8, the mold structure 110 is partially removed to form a trench 120, and the top surface of the etching stop film 104 is exposed. The mold structure 110 may be partially removed using, for example, a dry etching process.

In the dry etching process for forming the trench 120, the etching stop film 104 may have an etching selectivity with respect to the mold structure 110. Therefore, the trench 120 does not penetrate to the upper surface 100S of the substrate 100 and exposes the upper surface of the etching stop film 104. The dry etching process may be stopped when the upper surface of the etching stop film 104 is exposed.

Figure 9:
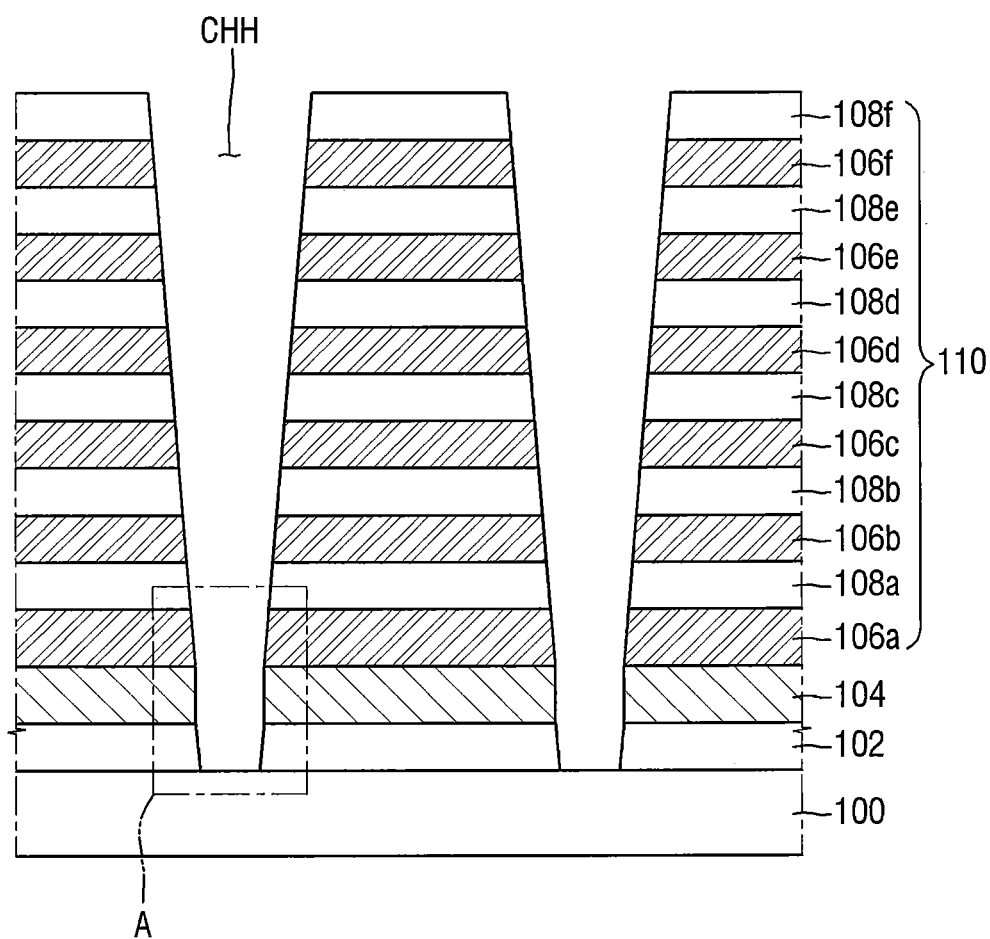

Referring to FIG. 9, the etching stop film 104 and the lower insulating film 102 exposed by the trench 120 are sequentially removed to form the channel hole CHH. The upper surface of the substrate 100 may be exposed by the channel hole CHH.

Removal of the etching stop film 104 may be etching of a portion of the etching stop film 104 exposed by the trench 120 using, for example, a dry etching process. Also, removal of the lower insulating film 102 may be performed using the same etching process as the process used to form the trench 120. In some embodiments, the etching process of forming the trench 120 and the etching process of removing the lower insulating film 102 may use the same etchant.

As described with reference to FIGS. 8 and 9, in the method of fabricating the nonvolatile memory device according to some embodiments of the present inventive concept, to form channel hole CHH, the mold structure 110 may be etched until the etching stop film 104 is exposed and then the etching stop film 104 and the lower insulating film 102 are removed to expose the upper surface 100S of the substrate 100.

As the integration density of nonvolatile memory devices has recently increased, more memory cells are concentrated on a single vertical channel. Thus, the nonvolatile memory devices may include a channel hole CHH having a high aspect ratio and a channel structure 200 formed in the channel hole CHH having a high aspect ratio.

As appreciated by present inventors, an etching process of forming the channel holes CHHs having a deep depth may form recesses in the substrate 100 if the etching stop film 104 does not exist as the mold structure 110 is directly adjacent to the substrate 100. Portions of the substrate 100 can be etched thereby forming recesses in the substrate 100 when the mold structure 110 is etched.

As appreciated by present inventors, it is difficult to control depths of the channel holes CHHs when the channel holes CHHs having high aspect ratios. Therefore, the depths of the recesses in the substrate 100 may be different from each other and may deteriorate performance of the device.

Methods of fabricating the nonvolatile memory device according to some embodiments of the present inventive concept, the mold structure 110 is etched until the etching stop film 104 is exposed, and then the etching stop film 104 and the lower insulating film 102 are removed through separate processes. Since removal of each of the etching stop film 104 and the lower insulating film 102 involve removal of the single film, it is relatively easy to control etch amount and variation of etch amounts.

That is, by using the etching stop film 104 and the lower insulating film 102 as a buffer film, the dispersion of the depths of the channel holes CHHs may be effectively controlled.

FIG. 10 is an enlarged view of the portion A of FIG. 9.

Referring to FIG. 10, the profile of the inner wall of the channel hole CHH is illustrated.

The inner wall of the channel hole CHH may be defined by the upper surface 100S of the substrate 100, and the sidewall of the lower insulating film 102, the etching stop film 104, the sacrificial films 106a to 106f, and the interlayer insulating films 108. Therefore, the upper surface 100S of the substrate 100, and the sidewalls of the lower insulating film 102, the etching stop film 104, the sacrificial films 106a to 106f, and the interlayer insulating films 108a may surround the channel hole CHH.

After the channel hole CHH is formed, the profile of the sidewall 104S of the etching stop film 104 and the profile of the sidewall 106S of the sacrificial films 106a to 106f may be different from each other. In some embodiments, the sidewall 104S of the etching stop film 104 may have a second angle θ2 with respect to the upper surface 100S of the substrate 100, the sidewall 106S of the lowermost sacrificial film 106a have a third angle θ3 with respect to the upper surface 100S of the substrate 100, and the second angle θ2 may be greater than the third angle θ3.

In some embodiments, the second angle θ2 may be different from the third angle θ3 because the etching stop film 104 and the lowermost sacrificial film 106a are removed under different conditions (e.g., different etchants, and different temperatures).

That is, as described above, the etching stop film 104 may include an oxide film such as TiO and ZrO, a carbide film such as C and SiC, and/or a nitride film such as TaN and AlN, and the sacrificial film 106a may include a silicon nitride film.

In some embodiments, reactivity of the etching stop film 104 against an etching solution or an etching gas may be higher than reactivity of the sacrificial film 106a against the etching solution or etching gas. Accordingly, the second angle θ2 may be greater than the third angle θ3.

Figure 11:
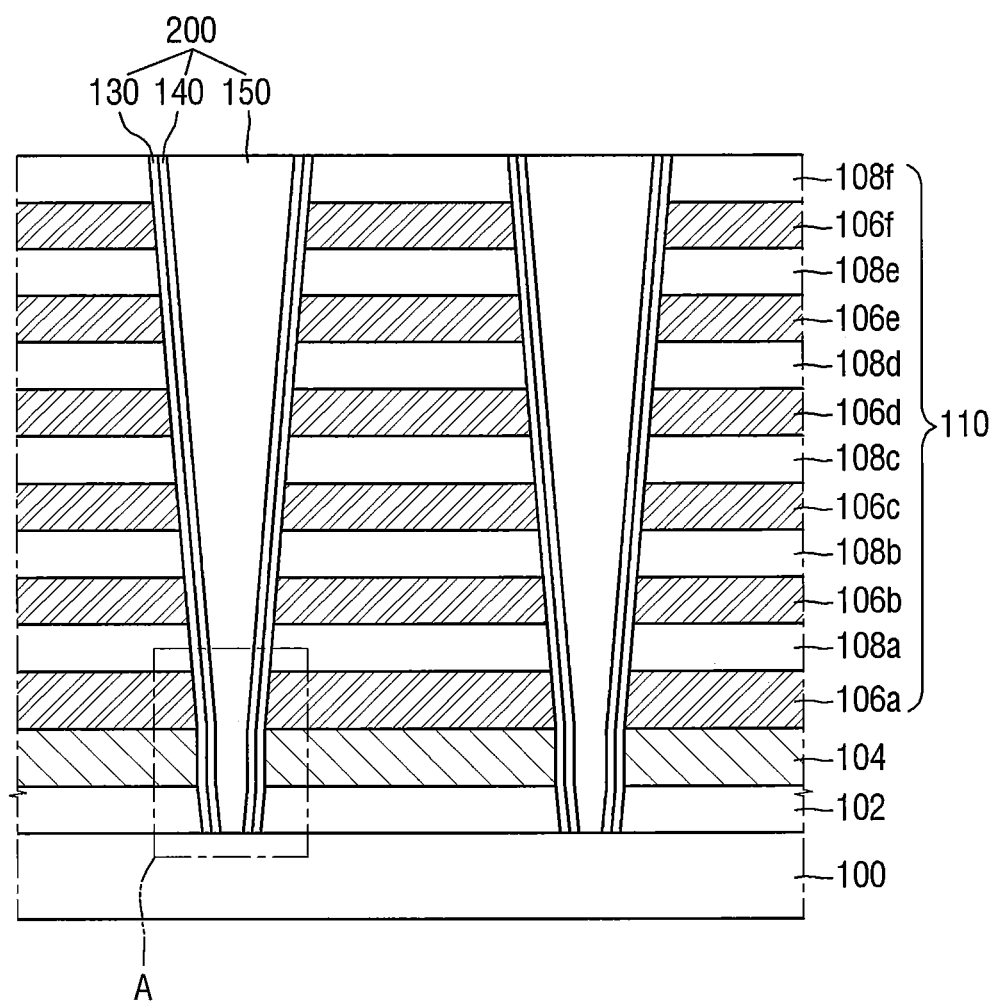
Figure 12:
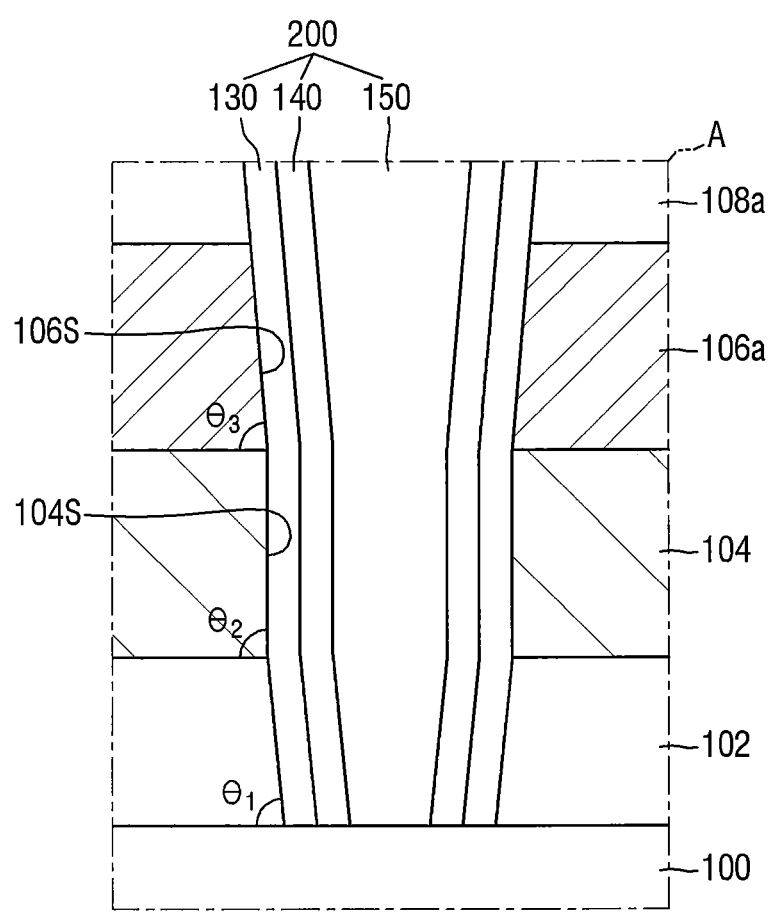

FIG. 12 is an enlarged view of the portion A of FIG. 11. Referring to FIGS. 11 and 12, the dielectric film 130, the channel film 140, and the filling film 150 are formed in the channel hole CHH. In some embodiments, the dielectric film 130, the channel film 140, and the filling film 150 may fill the channel hole CHH.

The dielectric film 130 may be formed along the sidewall and the bottom surface of the channel hole CHH. In some embodiments, the dielectric film 130 on the bottom surface of the channel hole CHH may be removed by, for example, an etch-back process.

As described above, the dielectric film 130 may be formed of a plurality of films such as the tunnel film and the trap film. Formation of the dielectric film 130 including the plurality of films may include, for example, but is not limited to, any one of CVD, PECVD, and ALD processes.

The channel film 140 may be formed along the surface of the dielectric film 130. In some embodiments, the dielectric film 130 is also formed on the upper surface 100S of the substrate 100, and a portion of the channel film 140 formed on the upper surface 100S of the substrate 100 may be removed by, for example, an etch-back process.

The channel film 140 may be formed using, for example, polysilicon and/or amorphous silicon doped with impurities.

The filling film 150 may be formed in the channel hole CHH. In some embodiments, the filling film 150 may completely fill the channel hole CHH. The outer surface of the filling film 150 may be surrounded by the dielectric film 130 and the channel film 140.

The filling film 150 may be formed of, for example, but is not limited to, a material such as a silicon oxide layer formed using one of CVD, PECVD, and ALD processes.

The channel structure 200 may be formed by forming the dielectric film 130, the channel film 140, and the filling film 150. In some embodiments, the channel structure 200 may fill the channel hole CHH and may extend through the mold structure 110.

Figure 13:
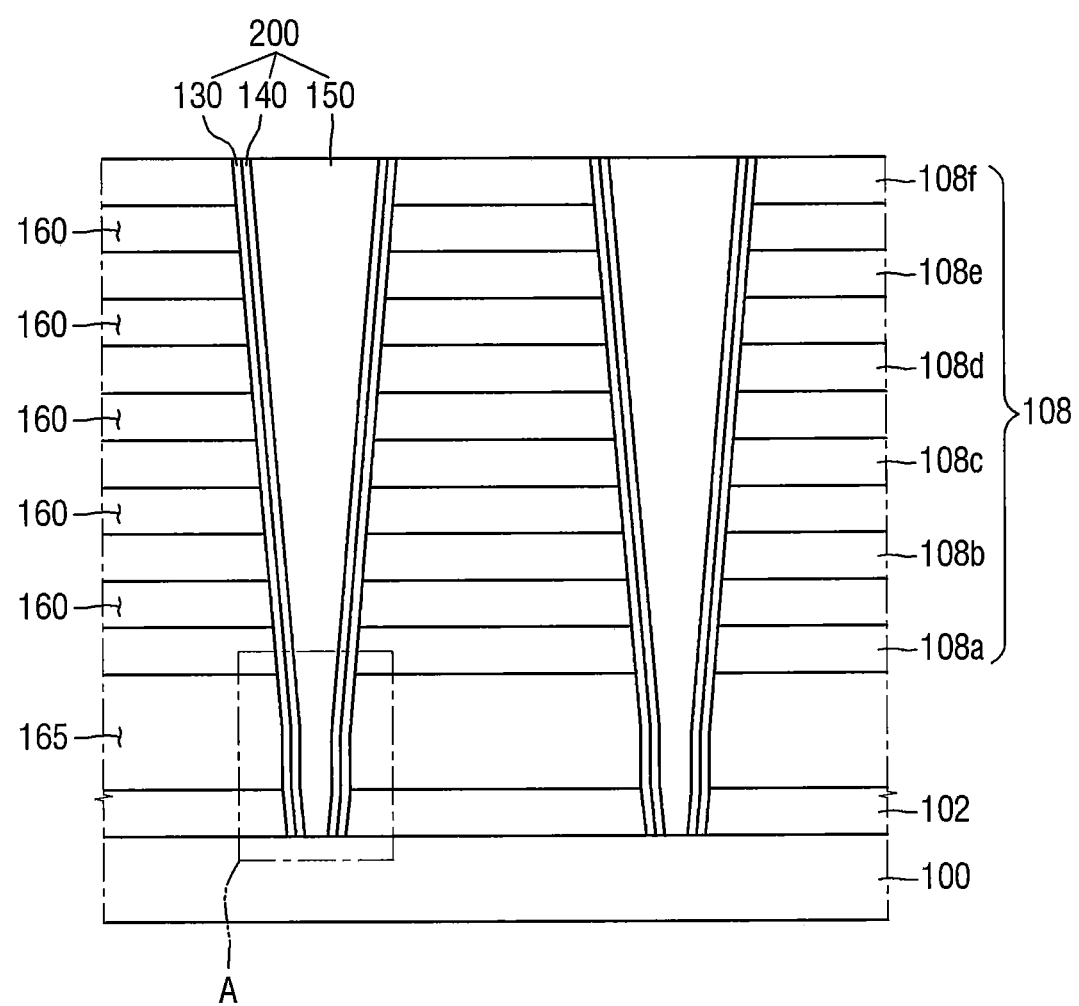
Figure 14:
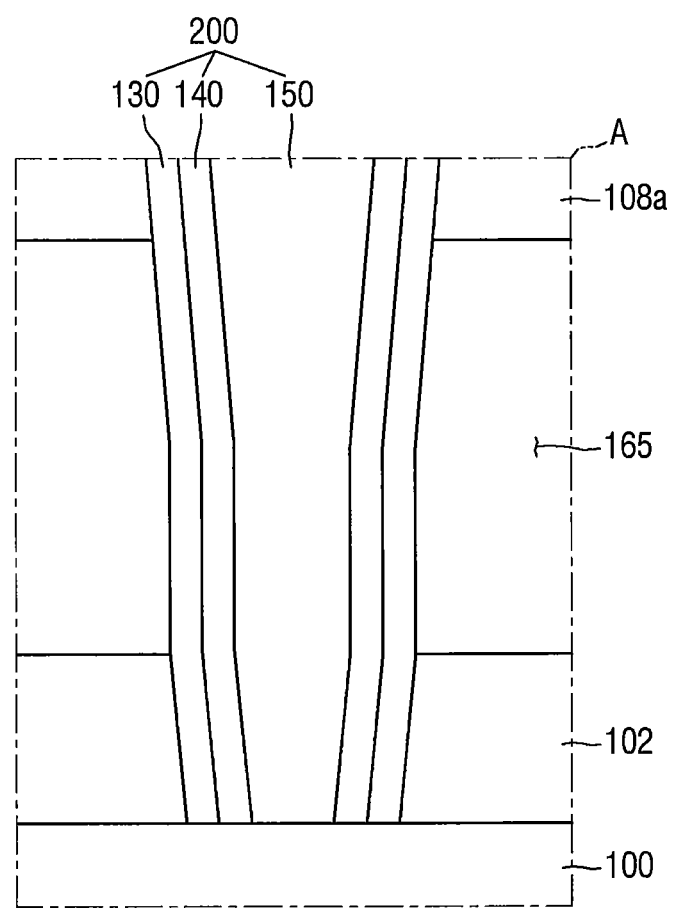

FIG. 14 is an enlarged view of the portion A of FIG. 13. Referring to FIGS. 13 and 14, the sacrificial films 106a to 106f and the etching stop film 104 are removed to form a space 165 between the lower insulating film 102 and the lowermost interlayer insulating film 108a, and spaces 160 between two adjacent ones the plurality of interlayer insulating films 108.

The sacrificial films 106a to 106f and the etching stop film 104 may be removed by the same process. Therefore, the sacrificial films 106a to 106f and the etching stop film 104 may be simultaneously removed. Removal of the sacrificial films 106a to 106f and the etching stop film 104 may be performed using, for example, phosphoric acid, sulfuric acid, hydrochloric acid, or a mixed solution thereof.

After the etching stop film 104 and the sacrificial films 106a to 106f are removed, the channel structure 200 has a horizontal sectional area having a circle shape, and the interlayer insulating films 108 may be spaced apart from each other in a vertical direction, which is perpendicular to the upper surface 100S of the substrate 100. The channel structure 200 may extend through the interlayer insulating films 108. Therefore, the interlayer insulating films 108a to 108f may be supported by the channel structure 200.

Figure 15:
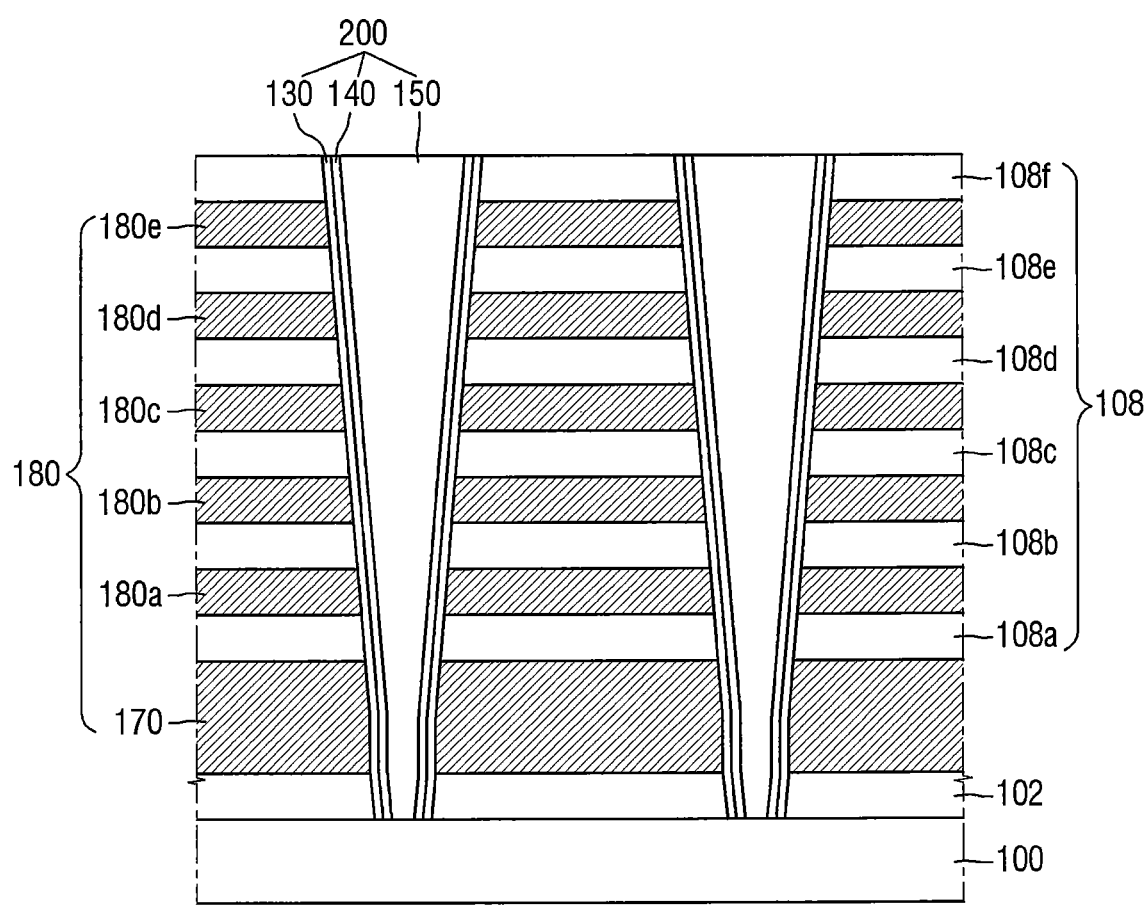

Referring to FIG. 15, a conductive films 180 may be formed in the spaces 160 and 165 formed by removing the sacrificial films 106a to 106f and the etching stop film 104.

The conductive film 180 may include a gate selection line 170 formed directly adjacent to the lower insulating film 102, and a plurality of gate lines 180a to 180e formed on the gate selection line 170.

The gate selection line 170 is formed to fill the space 165 formed by removal of both the etching stop film 104 and the sacrificial film 106a. Therefore, the gate selection line 170 may directly abut on the lower insulating film 102. The gate selection line 170 may directly contact an upper surface of the lower insulating film 102.

The gate lines 180a to 180e are formed to fill the spaces 160, respectively, formed by removal of the sacrificial films 106b to 106f.

In summary, the etching stop film 104 and the lowermost sacrificial film 106a may be replaced with the gate selection line 170, and the sacrificial films 106b to 106f may be replaced with the gate lines 180a to 180e, respectively.

The gate selection line 170 and the gate line 180a to 180e may be formed simultaneously. Specifically, the gate selection line 170 and the gate lines 180a to 180e may be formed by forming a conductive material using processes such as CVD, PECVD, and ALD.

The gate selection line 170 may completely fill the space 165. Therefore, the sidewalls of the gate selection line 170 may have the same profile as the profiles of the sidewall 104S of the etching stop film and the sidewall 106S of the sacrificial film.

That is, as described above, the second angle θ2 of the lower sidewall 171a of the gate selection line 170 with respect to the upper surface 100S of the substrate 100 may be different from the third angle θ3 of the upper sidewall 171b of the gate selection line 170 with respect to the upper surface 100S of the substrate 100.

Figure 16:
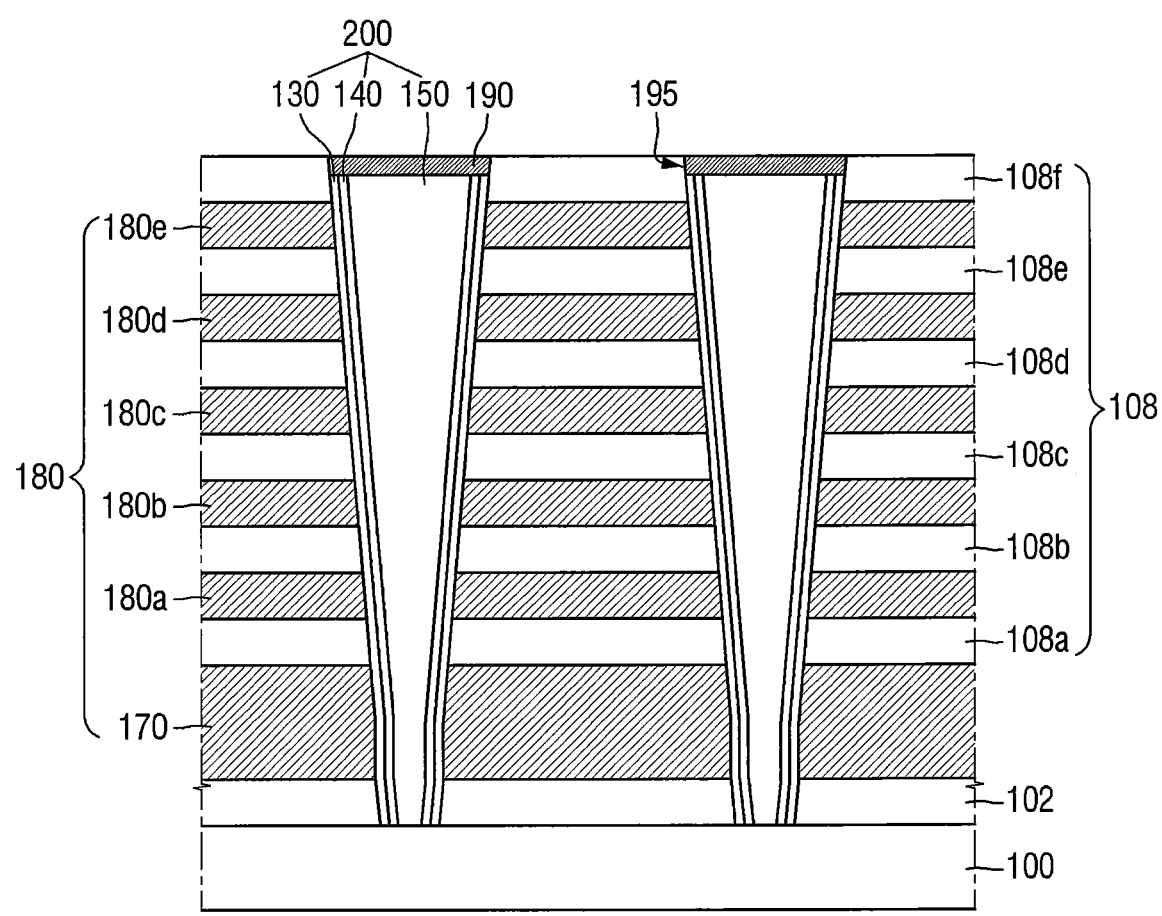

Referring to FIG. 16, a upper portion of the channel structure 200 is removed by, for example, an etch-back process to form a trench 195, and a pad 190 filling the trench 195 is formed.

The pad 190 may be formed in the channel hole CHH to cover the dielectric film 130, the channel film 140, and the filling film 150. The pad 190 may include, for example, but is not limited to, at least one of doped semiconductors, metals, metal silicide, and metal nitrides.

Referring again to FIG. 1, the upper insulating film 196 is formed to cover the pad 190, and a bit line 198 electrically connected to the conductive contact 197 is formed on the upper insulating film 196.

Figure 17:
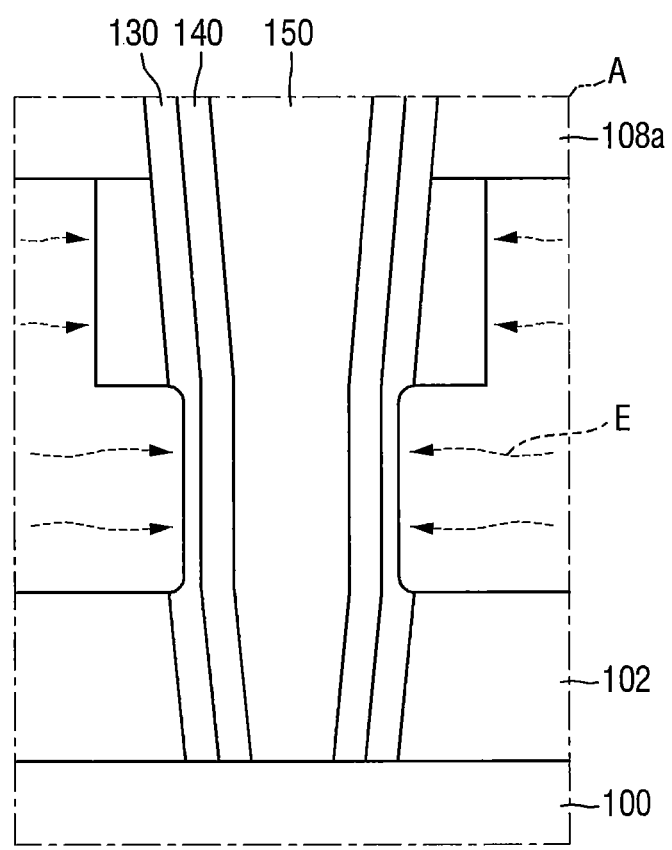
FIGS. 17 and 18 are views illustrating a method of fabricating a nonvolatile memory device according to some embodiments of the present inventive concept.
Figure 18:
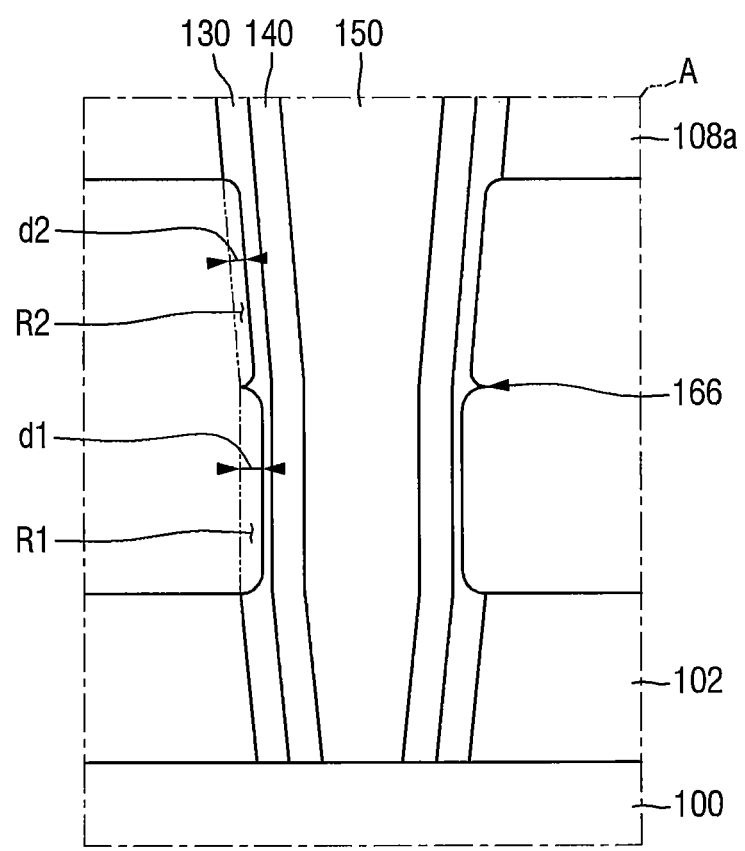

FIGS. 17 to 18 are views illustrating a method of fabricating the nonvolatile memory device illustrated in FIG. 3.

Referring to FIGS. 17 and 18 illustrate a removal process of the etching stop film 104 and the lowermost sacrificial film 106a. In some embodiments, the etching stop film 104 may be removed faster than the sacrificial films 106a through 106f. That is, in an wet etching process of removing the etching stop film 104 and the sacrificial films 106a to 106f, the sacrificial films 106a to 106f may have an etching selectivity with respect to the etching stop film 104.

As a result, the etching stop film 104 may be etched faster than the lowermost sacrificial film 106a. Subsequently, the outer wall of the dielectric film 130 is exposed to the etching solution E by the removal of the etching stop film 104, and the outer wall of the dielectric film 130 may be etched. A first recess R1 may be formed at the location of the dielectric film 130 which is exposed by etching the etching stop film 104 and is etched after the etching stop film 104 is etched.

In some embodiments, after etching of the lowermost sacrificial film 106a is completed, etching of the outer wall of the dielectric film 130 proceeds to some degree, and the second recess R2 may be formed in the dielectric film 130, as illustrated in FIG. 18. That is, the first recess R1 is formed on the outer wall of the dielectric film 130 which the etching stop film 104 contacted, and the second recess R2 is formed on the outer wall of the dielectric film 130 which the sacrificial film 106a contacted.

In some embodiments, the first depth d1 of the first recess R1 and the second depth d2 of the second recess R2 may be different from each other. Specifically, the first depth d1 of the first recess R1 may be larger (e.g., deeper) than the second depth d2 of the second recess R2.

This is because the lowermost sacrificial film 106a has an etching selectivity with respect to the etching stop film 104 in the wet etching process for removing the lowermost sacrificial film 106a and the etching stop film 104 as described above. The first recess R1 exposed to the etching solution E for a longer time due to etching of the etching stop film 104 faster than the sacrificial film 106a may be deeper than the second recess R2.

The dielectric film 130 may include a concave portion 166 between the first recess R1 and the second recess R2.

Thereafter, as illustrated in FIG. 3, a gate selection line 170 which fills the first recess R1 and the second recess R2 is formed. After the gate selection line 170 is formed, the process similar to that illustrated in FIG. 16 will be performed.

Figure 19:
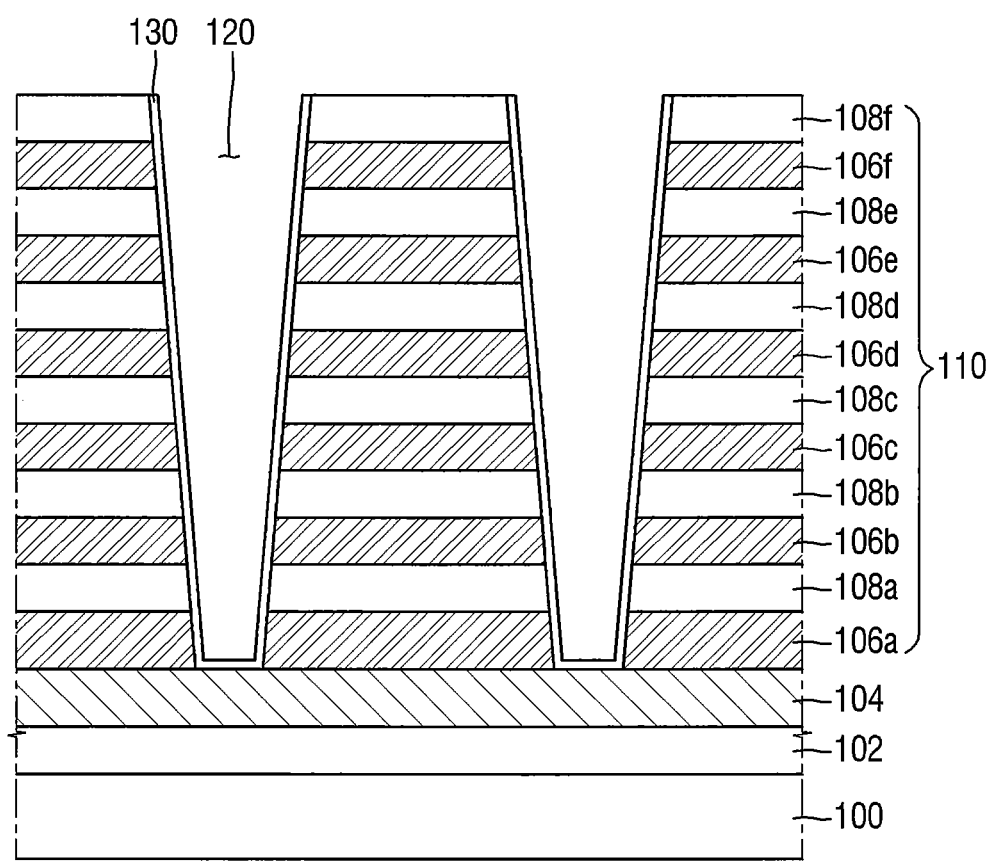
FIGS. 19 to 25 are views illustrating a method of fabricating a nonvolatile memory device according to some embodiments of the present inventive concept.

FIGS. 19 to 25 are views illustrating a method of fabricating a nonvolatile memory device according to some embodiments of the present inventive concept. Since processes performed before FIG. 19 are the same as or similar to the processes illustrated in FIGS. 6 to 8, those processes will not be described again.

Referring to FIG. 19, the dielectric film 130 is formed in the trench 120. The dielectric film 130 may be formed along the sidewalls and bottom surface of the trench 120. As described above, the dielectric film 130 may be formed of the plurality of films such as the tunnel film and the trap film. Formation of the dielectric film 130 including the plurality of films may include, for example, but is not limited to, any one of CVD, PECVD, and ALD processes.

The dielectric film 130 may not completely fill the inside of the trench 120.

Figure 20:
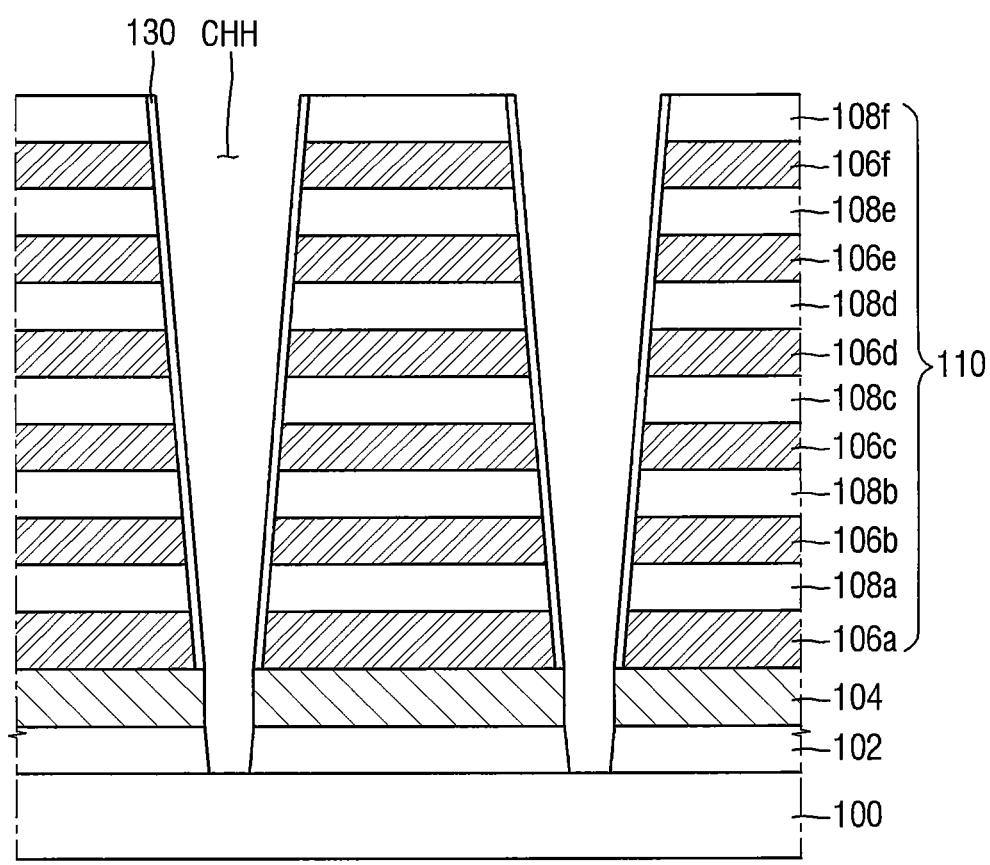

Referring to FIG. 20, the dielectric film 130, the etching stop film 104, and the lower insulating film 102 are removed to form the channel hole CHH. The upper surface of the substrate 100 may be exposed by the channel hole CHH.

The dielectric film 130 may be removed by an etch-back process. Through the above processes, a portion of the dielectric film 130 extending on the sidewall of the mold structure 110 may remain, and only a portion of the dielectric film 130 on the bottom surface of the trench 120 may be removed.

Removal of the etching stop film 104 may be etching of a portion of the etching stop film 104 exposed by the trench 120 using, for example, a dry etching process using etching gases. Also, removal of the lower insulating film 102 may use the same etching process (e.g., the same etchants) as the processes of forming the trench 120 described above.

Figure 21:
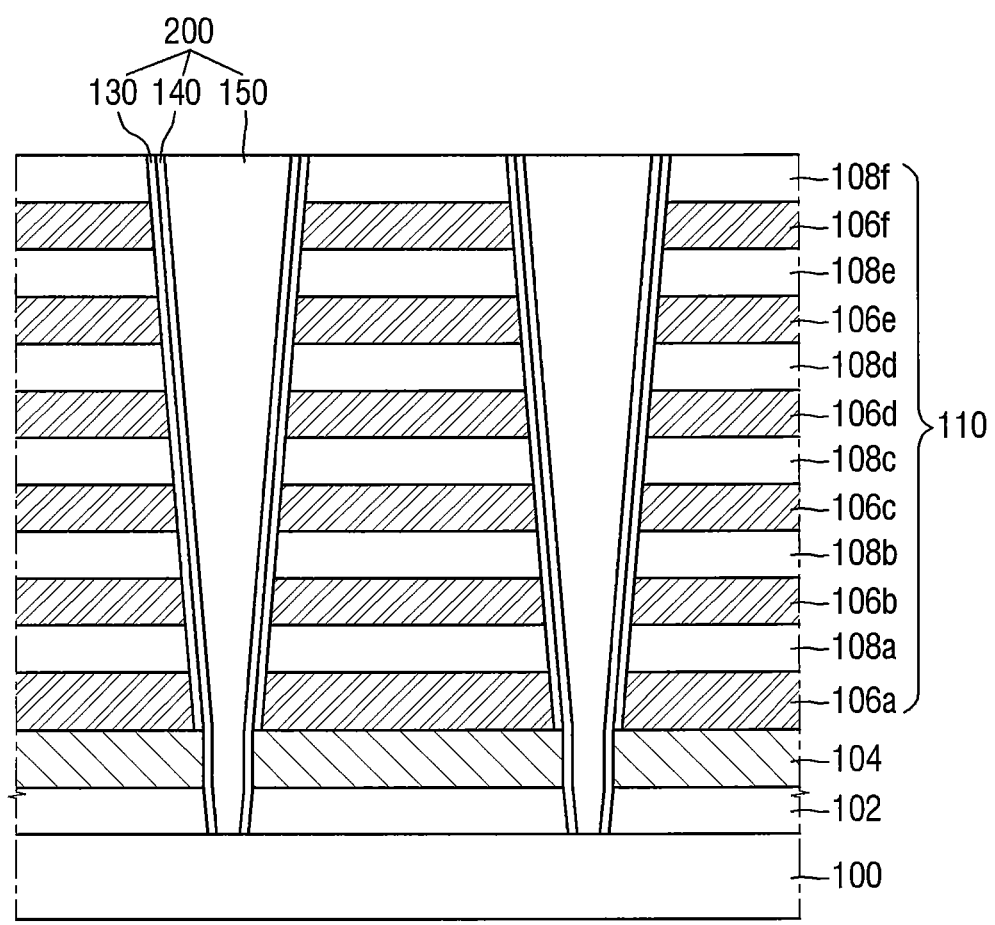

Referring to FIG. 21, a channel film 140 and a filling film 150 are formed in the channel hole CHH. In some embodiments, the channel film 140 and the filling film 150 may fill the channel hole CHH.

The channel film 140 may be formed along a surface of the dielectric film 130, and sidewalls of the etching stop film 104 and the lower insulating film 102.

The sidewall of the etching stop film 104 may directly contact the channel film 140. Unlike the aforementioned embodiment, the dielectric film 130 is not formed between the sidewall of the etching stop film 104 and the channel film 140.

Further, the sidewall of the lower insulating film 102 may directly contact the channel film 140. Unlike the aforementioned embodiment, the dielectric film 130 is not formed between the sidewall of the lower insulating film 102 and the channel film 140.

In some embodiments, the dielectric film 130 is also formed on the upper surface 100S of the substrate, and a portion of the channel film 140 formed on the upper surface 100S of the substrate may be removed by an etch-back process.

The channel film 140 may be formed using, for example, polysilicon or amorphous silicon doped with impurities.

The filling film 150 may be formed in the channel hole CHH. In some embodiments, the filling film 150 may be formed to completely fill the channel hole CHH. The outer surface of the filling film 150 may be surrounded by the dielectric film 130 and the channel film 140.

The filling film 150 may be formed of, for example, but is not limited to, a material such as a silicon oxide layer formed by one of CVD, PECVD, and ALD processes.

By forming the dielectric film 130, the channel film 140, and the filling film 150, the vertical channel structure 200 may be formed. The vertical channel structure 200 may fill the inside of the channel hole CHH and may pass through the mold structure 110.

Figure 22:
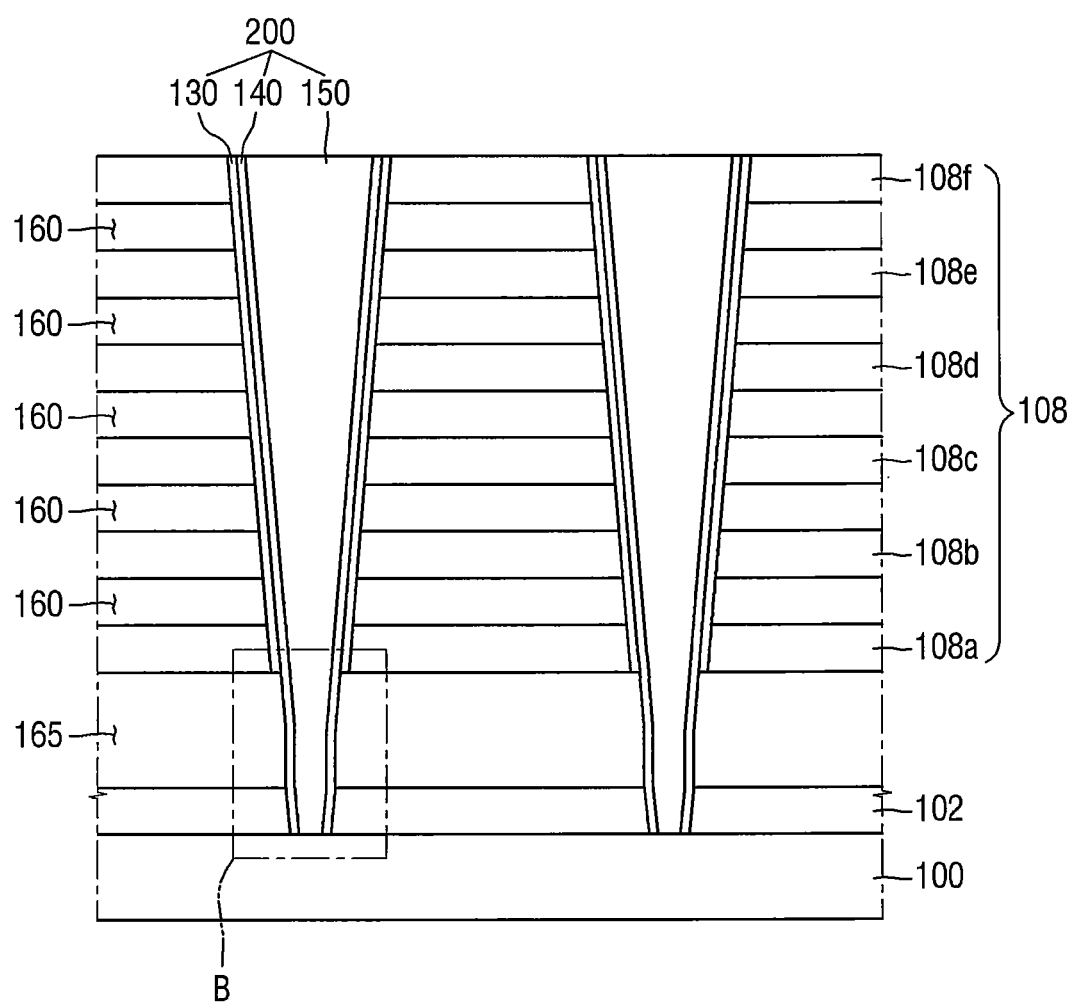
Figure 23:
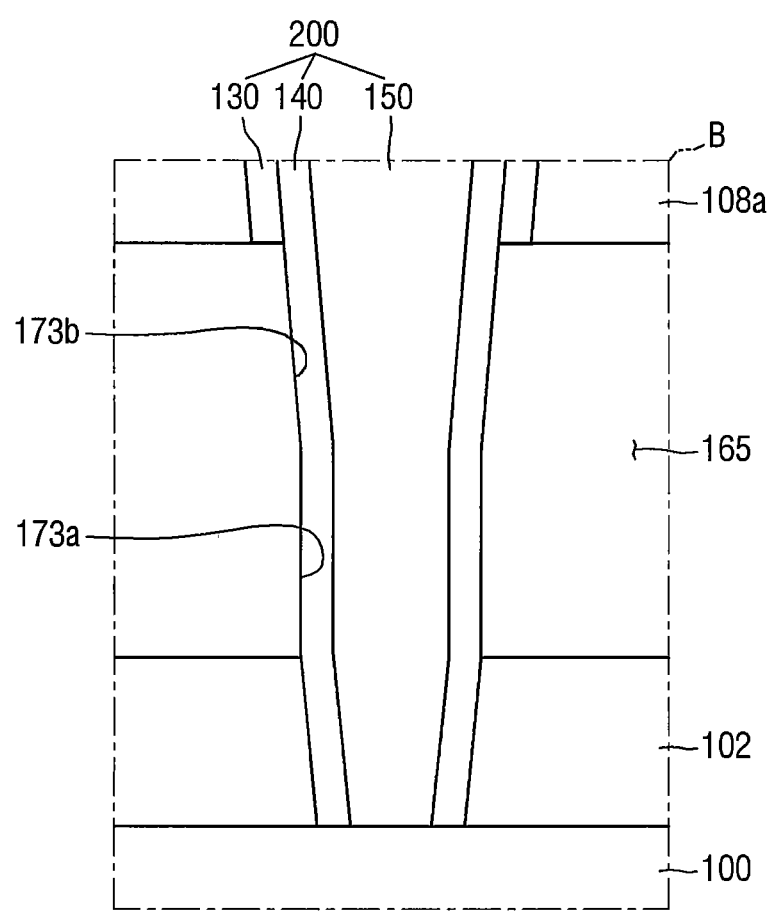

FIG. 23 is an enlarged view of the portion B of FIG. 22. Referring to FIGS. 22 and 23, the sacrificial films 106a to 106f and the etching stop film 104 are removed to form a space 165 between the lower insulating film 102 and the lowermost interlayer insulating film 108a, and spaces 160 between two adjacent ones of the plurality of interlayer insulating films 108.

The sacrificial films 106a to 106f and the etching stop film 104 may be removed by the same process. Therefore, the sacrificial films 106a to 106f and the etching stop film 104 may be simultaneously removed. Removal of the sacrificial films 106a to 106f and the etching stop film 104 may use phosphoric acid, sulfuric acid, hydrochloric acid, or a mixture thereof.

While the sacrificial films 106a to 106f being removed, portions of the dielectric film 130 being in contact with the sidewalls of the sacrificial films 106a to 106f may also be partially removed. Further, in some embodiments, While the sacrificial films 106a to 106f being removed, a portion of the dielectric film 130 contacting the lowermost sacrificial films 106a may be removed.

As illustrated in FIG. 23, the dielectric film 130 does not extend to the upper surface of the substrate 100. Therefore, the outer sidewalls 173a and 173b of the channel film 140 may be exposed by removal of the etching stop film 104. The outer sidewalls 173a and 173b of the channel film may define the space 165 together with the insulating films 108a and 102.

Figure 24:
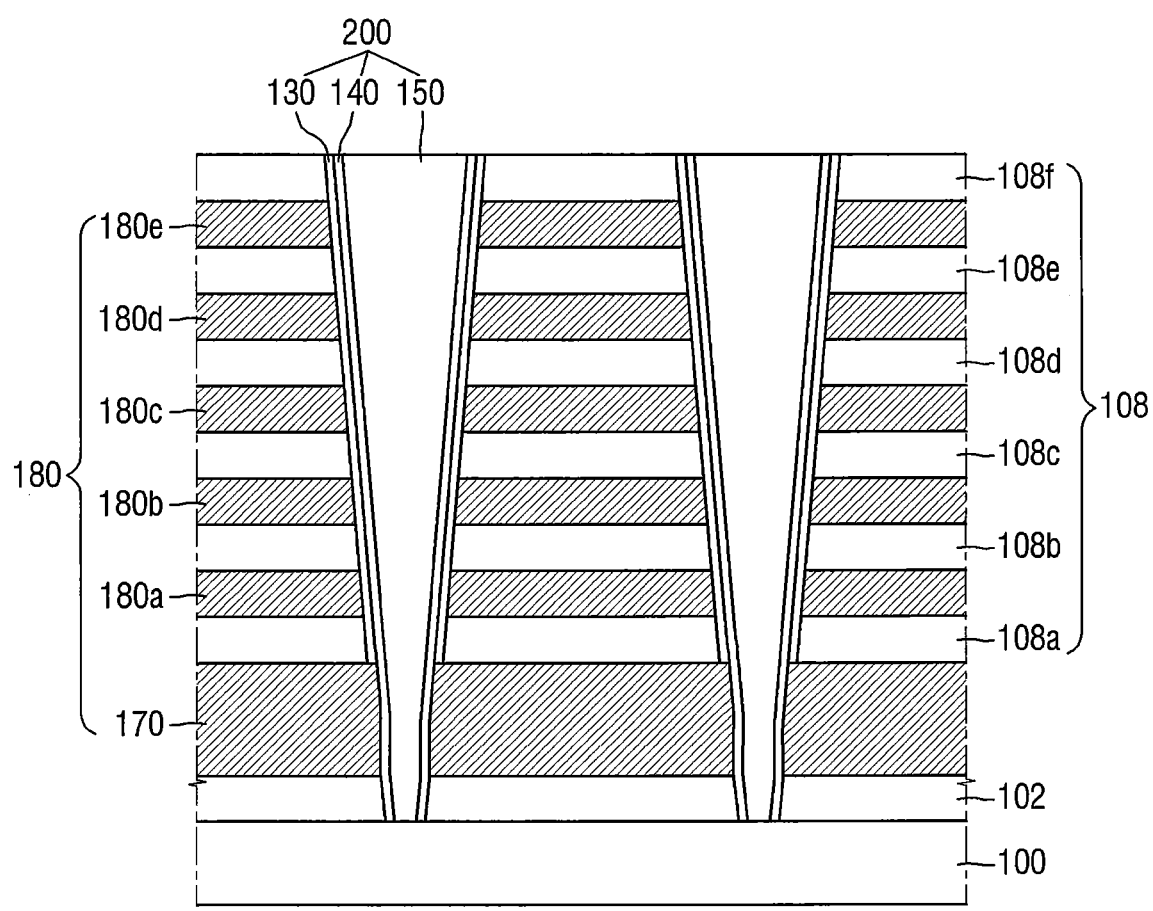
Figure 25:
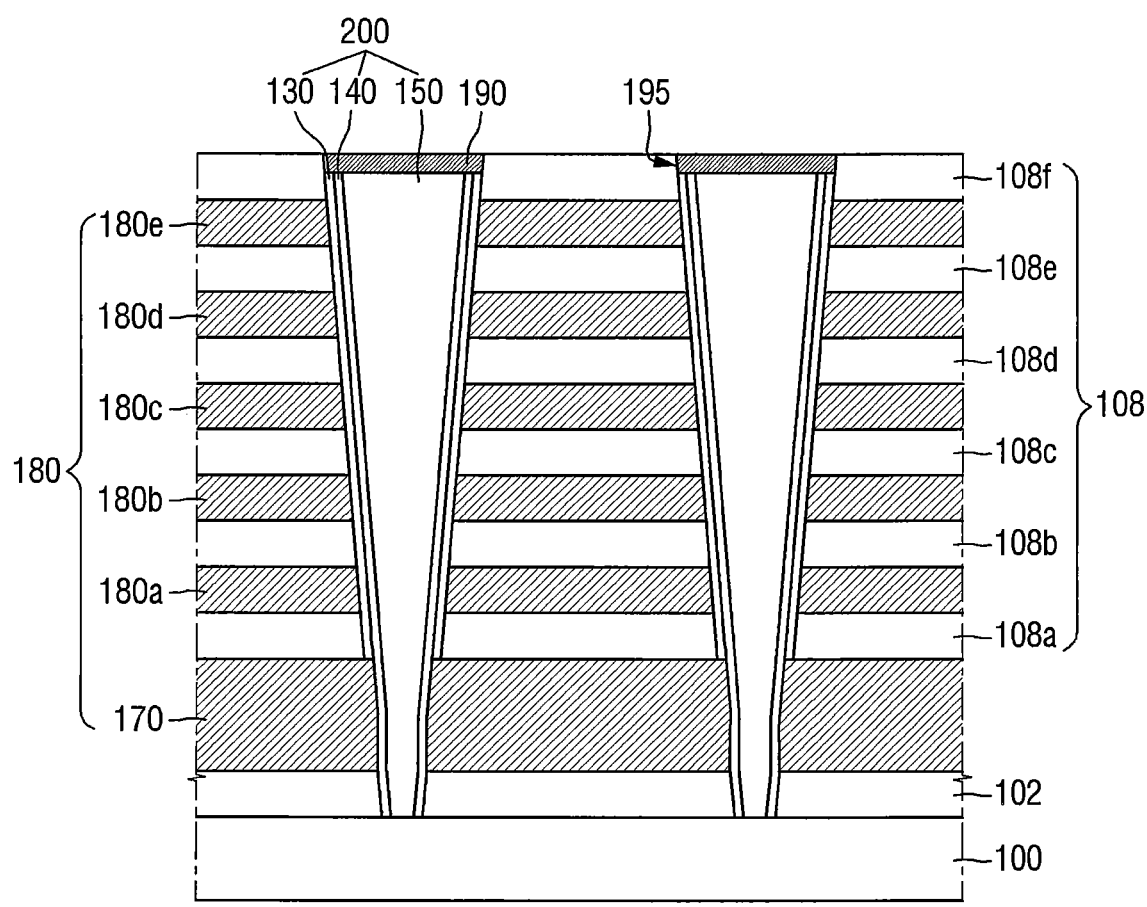

Referring to FIGS. 24 and 25, conductive films 180 are formed in the spaces 160 and 165 formed by removing the sacrificial films 106a to 106f and the etching stop film 104.

The conductive film 180 may include the gate selection line 170 formed adjacent to the lower insulating film 102, and a plurality of gate lines 180a to 180e formed on the gate selection line 170.

The gate selection line 170 is formed to fill the space 165 formed by the removal of both the etching stop film 104 and the sacrificial film 106a. Therefore, the gate selection line 170 may directly abut on the lower insulating film 102. The gate selection line 170 may directly contact an upper surface of the lower insulating film 102 as illustrated in FIG. 24.

The sidewalls 172a and 172b of the gate selection line 170 may not be covered with the dielectric film 130. The sidewalls 172a and 172b of the gate selection line 170 may be covered with the channel film 140. The sidewalls 172a and 172b of the gate selection line 170 may directly abut on the channel film 140. In some embodiments, the sidewalls 172a and 172b of the gate selection line 170 may directly contact the channel film 140 as illustrated in FIG. 24.

The gate lines 180a to 180e are formed to fill the space 160 formed by the removal of the remaining sacrificial films 106b to 106f.

The gate selection line 170 and the gate line 180a to 180e may be formed at the same time. Specifically, the gate selection line 170 and the gate lines 180a to 180e may be formed of the conductive material by processes such as CVD, PECVD, and ALD.

The gate selection line 170 may completely fill the space 165. Therefore, the sidewall of the gate selection line 170 may have the same profile as the profiles of the sidewall 104S of the etching stop film 104 and the sidewall 106S of the lowermost sacrificial film 106a.

That is, as described above with respect to FIG. 5, the lower sidewall 172a of the gate selection line 170 may have the second angle θ2 with respect to the upper surface 100S of the substrate 100, the upper sidewall 172b of the gate selection line 170 may have the third angle θ3 with respect to the upper surface 100S of the substrate 100, and the second angle θ2 may be different from the third angle θ3.

Referring to FIG. 25, a portion of the channel structure 200 is removed by the process such as an etch-back to form the trench 195, and a pad 190 filling the trench 195 is formed.

The pad 190 may be formed to cover the dielectric film 130, the channel film 140, and the filling film 150 in the channel hole CHH. The pad 190 may include, but is not limited to, at least one of, for example, doped semiconductors, metals, metal silicide, and metal nitrides.

Next, referring again to FIG. 4, the upper insulating film 196 is formed to cover the pad 190, and a bit line 198 electrically connected to the conductive contact 197 is formed on the upper insulating film 196.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A nonvolatile memory device comprising:
a stacked structure comprising a plurality of conductive films and a plurality of interlayer insulating films stacked in an alternate sequence on a substrate; and
a vertical channel structure extending through the stacked structure, wherein the plurality of conductive films comprise a selection line that is closest to the substrate among the plurality of conductive films,
wherein the selection line comprises a lower portion and an upper portion sequentially stacked on the substrate,
wherein a side of the upper portion of the selection line and a side of the lower portion of the selection line have different profiles, and
wherein the vertical channel structure comprises:
a dielectric film on a sidewall of the stacked structure;
a channel film on the dielectric film, the channel film defining a space therein; and
a filling film on the channel film, the filling film filling the space defined by the channel film,
wherein a lower surface of the filling film is closer to an upper surface of the substrate than a lower surface of the selection line.

2. The nonvolatile memory device of claim 1, wherein the filling film extends on the upper surface of the substrate.

3. The nonvolatile memory device of claim 1, wherein the selection line directly contacts the channel film.

4. The nonvolatile memory device of claim 1, wherein the side of the lower portion of the selection line has a first angle with respect to the upper surface of the substrate, and the side of the upper portion of the selection line has a second angle with respect to the upper surface of the substrate, and wherein the first angle is greater than the second angle.

5. The nonvolatile memory device of claim 1, wherein the vertical channel structure comprises a first recess contacting the lower portion of the selection line, and a second recess contacting the upper portion of the selection line, and
wherein a first depth of the first recess is different from a second depth of the second recess.

6. The nonvolatile memory device of claim 5, wherein the lower portion of the selection line fills the first recess, and the upper portion of the selection line fills the second recess.

7. The nonvolatile memory device of claim 5, wherein the first depth of the first recess is greater than the second depth of the second recess.

8. The nonvolatile memory device of claim 5, wherein the vertical channel structure comprises a protrusion between the first recess and the second recess.

9. The nonvolatile memory device of claim 5, wherein the selection line comprises a concave portion between the upper portion and the lower portion of the selection line.

10. The nonvolatile memory device of claim 1, wherein a lower surface of the vertical channel structure directly contacts the upper surface of the substrate.

11. A nonvolatile memory device comprising:
a stacked structure comprising a plurality of conductive films and a plurality of interlayer insulating films stacked in an alternate sequence on a substrate; and
a vertical channel structure extending through the stacked structure,
wherein the plurality of conductive films comprise a first conductive film that is closest to the substrate among the plurality of conductive films,
wherein the first conductive film comprises a lower portion and an upper portion sequentially stacked on the substrate,
wherein a side of the upper portion of the first conductive film has a profile different from a profile of a side of the lower portion of the first conductive film, and
wherein the vertical channel structure comprises:
a dielectric film on a sidewall of the stacked structure;
a channel film on the dielectric film, the channel film defining a space therein; and
a filling film on the channel film, the filling film filling the space defined by the channel film,
wherein a lower surface of the filling film is closer to an upper surface of the substrate than a lower surface of the first conductive film.

12. The nonvolatile memory device of claim 11, wherein the vertical channel structure comprises a first recess contacting the lower portion of the first conductive film, and a second recess contacting the upper portion of the first conductive film, and
wherein a first depth of the first recess is different from a second depth of the second recess.

13. The nonvolatile memory device of claim 12, wherein the first depth of the first recess is greater than the second depth of the second recess.

14. The nonvolatile memory device of claim 12, wherein the vertical channel structure comprises a protrusion between the first recess and the second recess.

15. The nonvolatile memory device of claim 11, wherein the plurality of conductive films further comprise a second conductive film, and
wherein the first conductive film has a first thickness in a vertical direction, the second conductive film has a second thickness in the vertical direction, and the first thickness is greater than the second thickness.

16. A nonvolatile memory device comprising:
a stacked structure comprising a plurality of conductive films and a plurality of interlayer insulating films stacked in an alternate sequence on a substrate; and a vertical channel structure extending through the stacked structure, wherein the plurality of conductive films comprise a selection line that is closest to the substrate among the plurality of conductive films, wherein the selection line comprises a lower portion and an upper portion sequentially stacked on the substrate, wherein a side of the lower portion of the selection line has a first angle with respect to an upper surface of the substrate, and a side of the upper portion of the selection line has a second angle with respect to the upper surface of the substrate, and wherein the first angle is greater than the second angle.

17. The nonvolatile memory device of claim 16, wherein the vertical channel structure comprises:
   a dielectric film on a sidewall of the stacked structure;
   a channel film on the dielectric film, the channel film defining a space therein; and
   a filling film in the space defined by the channel film.

18. The nonvolatile memory device of claim 17, wherein the filling film directly contacts the upper surface of the substrate.

19. The nonvolatile memory device of claim 18, wherein the selection line directly contacts the channel film.

20. The nonvolatile memory device of claim 16, wherein a lower surface of the vertical channel structure directly contacts the upper surface of the substrate.

* * * * *